(12) United States Patent
Shanjani

(10) Patent No.: US 11,476,849 B2
(45) Date of Patent: Oct. 18, 2022

(54) HIGH POWER POSITIVE LOGIC SWITCH

(71) Applicant: pSemi Corporation, San Diego, CA (US)

(72) Inventor: Payman Shanjani, San Diego, CA (US)

(73) Assignee: pSemi Corporation, San Diego, CA (US)

(*) Notice: Subject to any disclaimer, the term of this patent is extended or adjusted under 35 U.S.C. 154(b) by 0 days.

(21) Appl. No.: 17/141,706

(22) Filed: Jan. 5, 2021

(65) Prior Publication Data

US 2021/0211127 A1 Jul. 8, 2021

Related U.S. Application Data

(60) Provisional application No. 62/957,705, filed on Jan. 6, 2020.

(51) Int. Cl.
*H03K 17/687* (2006.01)
*H03K 19/017* (2006.01)

(52) U.S. Cl.
CPC ....... *H03K 17/6872* (2013.01); *H03K 19/017* (2013.01)

(58) Field of Classification Search
CPC ........... H03K 17/04106; H03K 17/063; H03K 17/08104; H03K 17/102; H03K 17/122;
(Continued)

(56) References Cited

U.S. PATENT DOCUMENTS 3,646,361 A 2/1972 Pfiffner
3,699,359 A 10/1972 Shelby
(Continued)

FOREIGN PATENT DOCUMENTS

CN 1256521 A 6/2000
DE 19832565 8/1999
(Continued)

OTHER PUBLICATIONS

Bonkowski, et al., "Integraton of Triple Band GSM Antenna Switch Module Using SOI CMOS", IEEE Radio Frequency Integrated Circuits Symposium, 2004, pp. 511-514.
(Continued)

*Primary Examiner* — Long Nguyen
(74) *Attorney, Agent, or Firm* — Jaquez Land Greenhaus & McFarland LLP; John Land, Esq.

(57) ABSTRACT

A positive-logic FET switch stack that does not require a negative bias voltage, and which can withstand application of a high voltage RF signal without requiring terminal capacitors. Some embodiments include a stack of FET switches, with at least one FET requiring a negative $V_{GS}$ to turn OFF and configured so as to not require a negative voltage, series-coupled on at least one end to an end-cap FET that turns OFF when the $V_{GS}$ of such end-cap FET is essentially zero volts, wherein at least one end-cap FET is configured to be coupled to a corresponding RF signal source and has a gate coupled to the corresponding RF signal source through an associated switch circuit. The switch circuit may include an NMOSFET and a PMOSFET, or a diode and an NMOSFET, or a diode and an NMOSFET and a PMOSFET.

21 Claims, 6 Drawing Sheets

(58) Field of Classification Search
CPC .. H03K 17/133; H03K 17/161; H03K 17/687; H03K 17/6872; H03K 17/693; H03K 17/74; H03K 17/76; H03K 19/017
See application file for complete search history.

(56) References Cited

U.S. PATENT DOCUMENTS

| | | |
|---|---|---|
| 3,975,671 A | 8/1976 | Stoll |
| 3,983,414 A | 9/1976 | Stafford et al. |
| 3,988,727 A | 10/1976 | Scott |
| 4,053,916 A | 10/1977 | Cricchi et al. |
| 4,139,826 A | 2/1979 | Pradal |
| 4,145,719 A | 3/1979 | Hand et al. |
| 4,244,000 A | 1/1981 | Ueda et al. |
| 4,256,977 A | 3/1981 | Hendrickson |
| 4,316,101 A | 2/1982 | Minner |
| 4,317,055 A | 2/1982 | Yoshida et al. |
| 4,367,421 A | 1/1983 | Baker |
| 4,390,798 A | 6/1983 | Kurafuji |
| RE31,749 E | 11/1984 | Yamashiro |
| 4,638,184 A | 1/1987 | Kimura |
| 4,736,169 A | 4/1988 | Weaver et al. |
| 4,739,191 A | 4/1988 | Puar |
| 4,746,960 A | 5/1988 | Valeri et al. |
| 4,748,485 A | 5/1988 | Vasudev |
| 4,809,056 A | 2/1989 | Shirato et al. |
| 4,810,911 A | 3/1989 | Noguchi |
| 4,825,145 A | 4/1989 | Tanaka et al. |
| 4,849,651 A | 7/1989 | Estes, Jr. |
| 4,883,976 A | 11/1989 | Deane |
| 4,890,077 A | 12/1989 | Sun |
| 4,891,609 A | 1/1990 | Eilley |
| 4,906,587 A | 3/1990 | Blake |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 4,999,585 A | 3/1991 | Burt et al. |
| 5,001,528 A | 3/1991 | Bahraman |
| 5,012,123 A | 4/1991 | Ayasli et al. |
| 5,023,494 A | 6/1991 | Tsukii et al. |
| 5,061,907 A | 10/1991 | Rasmussen |
| 5,061,911 A | 10/1991 | Weidman et al. |
| 5,081,706 A | 1/1992 | Kim |
| 5,095,348 A | 3/1992 | Houston |
| 5,107,152 A | 4/1992 | Jain et al. |
| 5,124,762 A | 6/1992 | Childs et al. |
| 5,125,007 A | 6/1992 | Yamaguchi et al. |
| 5,146,178 A | 9/1992 | Nojima et al. |
| 5,148,393 A | 9/1992 | Furuyama |
| 5,157,279 A | 10/1992 | Lee |
| 5,182,529 A | 1/1993 | Chern |
| 5,208,557 A | 5/1993 | Kersh, III |
| 5,272,457 A | 12/1993 | Heckaman et al. |
| 5,274,343 A | 12/1993 | Russell et al. |
| 5,283,457 A | 2/1994 | Matloubian |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,319,604 A | 6/1994 | Imondi et al. |
| 5,345,422 A | 9/1994 | Redwine |
| 5,350,957 A | 9/1994 | Cooper et al. |
| 5,375,257 A | 12/1994 | Lampen |
| 5,382,826 A | 1/1995 | Mojaradi et al. |
| 5,405,795 A | 3/1995 | Beyer et al. |
| 5,416,043 A | 5/1995 | Burgener et al. |
| 5,422,590 A | 6/1995 | Coffman et al. |
| 5,442,327 A | 8/1995 | Longbrake et al. |
| 5,446,418 A | 8/1995 | Hara et al. |
| 5,448,207 A | 9/1995 | Kohama |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,548,239 A | 8/1996 | Kohama |
| 5,553,295 A | 9/1996 | Pantelakis et al. |
| 5,554,892 A | 9/1996 | Norimatsu |
| 5,559,368 A | 9/1996 | Hu et al. |
| 5,572,040 A | 11/1996 | Reedy et al. |
| 5,576,647 A | 11/1996 | Sutardja |
| 5,578,853 A | 11/1996 | Hayashi et al. |
| 5,581,106 A | 12/1996 | Hayashi et al. |
| 5,594,371 A | 1/1997 | Douseki |
| 5,596,205 A | 1/1997 | Reedy et al. |
| 5,597,739 A | 1/1997 | Sumi et al. |
| 5,600,169 A | 2/1997 | Burgener et al. |
| 5,600,588 A | 2/1997 | Kawashima |
| 5,610,533 A | 3/1997 | Arimoto et al. |
| 5,629,655 A | 5/1997 | Dent |
| 5,663,570 A | 9/1997 | Reedy et al. |
| 5,670,907 A | 9/1997 | Gorecki et al. |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,734,291 A | 3/1998 | Tasdighi et al. |
| 5,748,016 A | 5/1998 | Kurosawa |
| 5,748,053 A | 5/1998 | Kameyama et al. |
| 5,753,955 A | 5/1998 | Fechner |
| 5,760,652 A | 6/1998 | Yamamoto et al. |
| 5,767,549 A | 6/1998 | Chen et al. |
| 5,774,411 A | 6/1998 | Hsieh et al. |
| 5,774,792 A | 6/1998 | Tanaka et al. |
| 5,784,687 A | 6/1998 | Itoh et al. |
| 5,777,530 A | 7/1998 | Nakatuka |
| 5,784,311 A | 7/1998 | Assaderaghi et al. |
| 5,793,246 A | 8/1998 | Vest et al. |
| 5,801,577 A | 9/1998 | Tailliet |
| 5,804,858 A | 9/1998 | Hsu et al. |
| 5,807,772 A | 9/1998 | Takemura |
| 5,808,505 A | 9/1998 | Tsukada |
| 5,812,939 A | 9/1998 | Kohama |
| 5,814,899 A | 9/1998 | Okumura et al. |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,769 A | 10/1998 | Douseki |
| 5,821,800 A | 10/1998 | Le et al. |
| 5,825,227 A | 10/1998 | Kohama et al. |
| 5,861,336 A | 1/1999 | Reedy et al. |
| 5,864,328 A | 1/1999 | Kajimoto |
| 5,863,823 A | 2/1999 | Burgener |
| 5,874,836 A | 2/1999 | Nowak et al. |
| 5,874,849 A | 2/1999 | Marotta et al. |
| 5,877,978 A | 3/1999 | Morishita et al. |
| 5,878,331 A | 3/1999 | Yamamoto et al. |
| 5,880,620 A | 3/1999 | Gitlin et al. |
| 5,883,396 A | 3/1999 | Reedy et al. |
| 5,883,541 A | 3/1999 | Tahara et al. |
| 5,892,260 A | 4/1999 | Okumura et al. |
| 5,892,382 A | 4/1999 | Ueda et al. |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pasternak |
| 5,917,362 A | 6/1999 | Kohama |
| 5,920,093 A | 7/1999 | Huang et al. |
| 5,920,233 A | 7/1999 | Denny |
| 5,926,466 A | 7/1999 | Ishida et al. |
| 5,930,605 A | 7/1999 | Mistry et al. |
| 5,930,638 A | 7/1999 | Reedy et al. |
| 5,945,867 A | 8/1999 | Uda et al. |
| 5,953,557 A | 9/1999 | Kawahara |
| 5,959,335 A | 9/1999 | Bryant et al. |
| 5,969,560 A | 10/1999 | Kohama et al. |
| 5,973,363 A | 10/1999 | Staab et al. |
| 5,973,364 A | 10/1999 | Kawanaka |
| 5,973,382 A | 10/1999 | Burgener et al. |

(56) References Cited

U.S. PATENT DOCUMENTS

| | | |
|---|---|---|
| 5,973,636 A | 10/1999 | Okubo et al. |
| 5,986,518 A | 11/1999 | Dougherty |
| 5,990,580 A | 11/1999 | Weigand |
| 6,020,778 A | 2/2000 | Shigehara |
| 6,020,781 A | 2/2000 | Fujioka |
| 6,049,110 A | 4/2000 | Koh |
| 6,057,555 A | 5/2000 | Reedy et al. |
| 6,057,723 A | 5/2000 | Yamaji et al. |
| 6,061,267 A | 5/2000 | Houston |
| 6,063,686 A | 5/2000 | Masuda et al. |
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,443 A | 6/2000 | Morishita et al. |
| 6,081,694 A | 6/2000 | Matsuura et al. |
| 6,084,255 A | 7/2000 | Ueda et al. |
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,114,923 A | 9/2000 | Mizutani |
| 6,118,343 A | 9/2000 | Winslow |
| 6,122,185 A | 9/2000 | Utsunomiya et al. |
| 6,130,570 A | 10/2000 | Pan et al. |
| 6,133,752 A | 10/2000 | Kawagoe |
| 6,137,367 A | 10/2000 | Ezzedine et al. |
| 6,160,292 A | 12/2000 | Flaker et al. |
| 6,169,444 B1 | 1/2001 | Thurber, Jr. |
| 6,172,378 B1 | 1/2001 | Hull et al. |
| 6,173,235 B1 | 1/2001 | Maeda |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,449 B1 | 2/2001 | Shimo |
| 6,195,307 B1 | 2/2001 | Umezawa et al. |
| 6,201,761 B1 | 3/2001 | Wollesen |
| 6,218,248 B1 | 3/2001 | Hwang et al. |
| RE37,124 E | 4/2001 | Monk et al. |
| 6,215,360 B1 | 4/2001 | Callaway, Jr. |
| 6,218,890 B1 | 4/2001 | Yamaguchi et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,027 B1 | 6/2001 | Burr |
| 6,249,029 B1 | 6/2001 | Bryant et al. |
| 6,249,446 B1 | 6/2001 | Shearon et al. |
| 6,281,737 B1 | 8/2001 | Kuang et al. |
| 6,288,458 B1 | 9/2001 | Berndt |
| 6,297,687 B1 | 10/2001 | Sugimura |
| 6,300,796 B1 | 10/2001 | Troutman et al. |
| 6,304,110 B1 | 10/2001 | Hirano |
| 6,308,047 B1 | 10/2001 | Yamamoto et al. |
| 6,310,508 B1 | 10/2001 | Westerman |
| 6,316,983 B1 | 11/2001 | Kitamura |
| 6,320,225 B1 | 11/2001 | Hargrove et al. |
| 6,337,594 B1 | 1/2002 | Hwang |
| 6,341,087 B1 | 1/2002 | Kunikiyo |
| 6,355,957 B1 | 3/2002 | Maeda et al. |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Bancal et al. |
| 6,387,739 B1 | 5/2002 | Smith |
| 6,392,440 B2 | 5/2002 | Nebel |
| 6,392,467 B1 | 5/2002 | Oowaki et al. |
| 6,396,325 B2 | 5/2002 | Goodell |
| 6,400,211 B1 | 6/2002 | Yokomizo et al. |
| 6,407,427 B1 | 6/2002 | Oh |
| 6,407,614 B1 | 6/2002 | Takahashi |
| 6,411,156 B1 | 6/2002 | Borkar et al. |
| 6,414,353 B2 | 7/2002 | Maeda et al. |
| 6,414,863 B1 | 7/2002 | Bayer et al. |
| 6,429,487 B1 | 8/2002 | Kunikiyo |
| 6,429,632 B1 | 8/2002 | Forbes et al. |
| 6,429,723 B1 | 8/2002 | Hastings |
| 6,433,587 B1 | 8/2002 | Assaderaghi et al. |
| 6,433,589 B1 | 8/2002 | Lee |
| 6,452,232 B1 | 9/2002 | Adan |
| 6,461,902 B1 | 10/2002 | Xu et al. |
| 6,466,082 B1 | 10/2002 | Krishnan |
| 6,469,568 B2 | 10/2002 | Toyoyama et al. |
| 6,486,511 B1 | 11/2002 | Nathanson et al. |
| 6,486,729 B2 | 11/2002 | Imamiya |
| 6,498,058 B1 | 12/2002 | Bryant et al. |
| 6,498,370 B1 | 12/2002 | Kim et al. |
| 6,504,212 B1 | 1/2003 | Allen et al. |
| 6,504,213 B1 | 1/2003 | Ebina |
| 6,512,269 B1 | 1/2003 | Bryant et al. |
| 6,518,645 B2 | 2/2003 | Bae et al. |
| 6,521,959 B2 | 2/2003 | Kim et al. |
| 6,531,356 B1 | 3/2003 | Hayashi |
| 6,537,861 B1 | 3/2003 | Kroell et al. |
| 6,559,689 B1 | 5/2003 | Clark |
| 6,563,366 B1 | 5/2003 | Kohama |
| 6,573,533 B1 | 6/2003 | Yamazaki |
| 6,608,785 B2 | 8/2003 | Chuang et al. |
| 6,608,789 B2 | 8/2003 | Sullivan et al. |
| 6,617,933 B2 | 9/2003 | Ito et al. |
| 6,631,505 B2 | 10/2003 | Arai |
| 6,632,724 B2 | 10/2003 | Henley et al. |
| 6,642,578 B1 | 11/2003 | Arnold et al. |
| 6,646,305 B2 | 11/2003 | Assaderaghi et al. |
| 6,653,697 B2 | 11/2003 | Hidaka et al. |
| 6,670,655 B2 | 12/2003 | Lukes et al. |
| 6,677,641 B2 | 1/2004 | Kocon |
| 6,677,803 B1 | 1/2004 | Chiba |
| 6,684,065 B2 | 1/2004 | Bult |
| 6,693,326 B2 | 2/2004 | Adan |
| 6,693,498 B1 | 2/2004 | Sasabata et al. |
| 6,698,082 B2 | 3/2004 | Crenshaw et al. |
| 6,698,498 B1 | 3/2004 | Crenshaw et al. |
| 6,703,863 B2 | 3/2004 | Gion |
| 6,704,550 B1 | 3/2004 | Kohama et al. |
| 6,711,397 B1 | 3/2004 | Petrov et al. |
| 6,714,065 B2 | 3/2004 | Komiya et al. |
| 6,717,458 B1 | 4/2004 | Potanin |
| 6,762,477 B2 | 7/2004 | Kunikiyo |
| 6,774,701 B1 | 8/2004 | Heston et al. |
| 6,781,805 B1 | 8/2004 | Urakawa |
| 6,788,130 B2 | 9/2004 | Pauletti et al. |
| 6,790,747 B2 | 9/2004 | Henley et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,016 B2 | 11/2004 | Sander et al. |
| 6,819,938 B2 | 11/2004 | Sahota |
| 6,830,963 B1 | 12/2004 | Forbes |
| 6,836,172 B2 | 12/2004 | Okashita |
| 6,870,241 B2 | 3/2005 | Nakatani et al. |
| 6,871,059 B1 | 3/2005 | Piro et al. |
| 6,879,502 B2 | 4/2005 | Yoshida et al. |
| 6,882,210 B2 | 4/2005 | Asano et al. |
| 6,891,234 B1 | 5/2005 | Connelly et al. |
| 6,897,701 B2 | 5/2005 | Chen et al. |
| 6,898,778 B2 | 5/2005 | Kawanaka |
| 6,901,023 B2 | 5/2005 | Kirsch et al. |
| 6,903,596 B2 | 6/2005 | Geller et al. |
| 6,908,832 B2 | 6/2005 | Farrens et al. |
| 6,917,258 B2 | 7/2005 | Kushitani et al. |
| 6,933,744 B2 | 8/2005 | Das et al. |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Fukamachi et al. |
| 7,058,922 B2 | 6/2006 | Kawanaka |
| 7,082,293 B1 | 7/2006 | Rofougaran et al. |

(56) References Cited

U.S. PATENT DOCUMENTS

| | | |
|---|---|---|
| 7,092,677 B1 | 8/2006 | Zhang et al. |
| 7,098,755 B2 | 8/2006 | Zhao |
| 7,109,532 B1 | 9/2006 | Lee et al. |
| 7,123,898 B2 | 10/2006 | Burgener et al. |
| 7,129,545 B2 | 10/2006 | Cain |
| 7,132,873 B2 | 11/2006 | Hollmer |
| 7,138,846 B2 | 11/2006 | Suwa et al. |
| 7,161,197 B2 | 1/2007 | Nakatsuka et al. |
| 7,173,471 B2 | 2/2007 | Nakatsuka et al. |
| 7,199,635 B2 | 4/2007 | Nakatsuka et al. |
| 7,212,788 B2 | 5/2007 | Weber et al. |
| 7,266,014 B2 | 9/2007 | Wu et al. |
| 7,269,392 B2 | 9/2007 | Nakajima et al. |
| 7,307,490 B2 | 12/2007 | Kizuki |
| 7,345,342 B2 | 3/2008 | Challa |
| 7,345,521 B2 | 3/2008 | Takahashi et al. |
| 7,355,455 B2 | 4/2008 | Hidaka |
| 7,391,282 B2 | 6/2008 | Nakatsuka et al. |
| 7,404,157 B2 | 7/2008 | Tanabe |
| 7,405,982 B1 | 7/2008 | Flaker et al. |
| 7,432,552 B2 | 10/2008 | Park |
| 7,459,988 B1 | 12/2008 | Iversen |
| 7,460,852 B2 | 12/2008 | Burgener et al. |
| 7,492,209 B2 | 2/2009 | Prikhodko |
| 7,492,238 B2 | 2/2009 | Nakatsuka |
| 7,515,882 B2 | 4/2009 | Kelcourse et al. |
| 7,518,458 B2 | 4/2009 | Nakamura et al. |
| 7,535,320 B2 | 5/2009 | Buer |
| 7,546,089 B2 | 6/2009 | Bellantoni |
| 7,554,789 B2 | 6/2009 | Chen |
| 7,561,853 B2 | 7/2009 | Miyazawa |
| 7,564,103 B2 | 7/2009 | Losehand et al. |
| 7,616,482 B2 | 11/2009 | Prall |
| 7,619,462 B2 | 11/2009 | Kelly et al. |
| 7,659,152 B2 | 2/2010 | Gonzalez et al. |
| 7,710,189 B2 | 5/2010 | Toda |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,796,969 B2 | 9/2010 | Kelly et al. |
| 7,860,499 B2 | 12/2010 | Burgener et al. |
| 7,890,891 B2 | 2/2011 | Stuber et al. |
| 7,910,993 B2 | 3/2011 | Brindle et al. |
| 7,928,759 B2 | 4/2011 | Hidaka |
| 7,960,772 B2 | 6/2011 | Englekirk |
| 7,982,265 B2 | 7/2011 | Challa et al. |
| 7,984,408 B2 | 7/2011 | Cheng et al. |
| 8,081,928 B2 | 12/2011 | Kelly |
| 8,129,787 B2 | 3/2012 | Brindle et al. |
| 8,330,519 B2 | 12/2012 | Lam et al. |
| 8,334,718 B2 | 12/2012 | Granger-Jones et al. |
| 8,373,490 B2 | 2/2013 | Burgener et al. |
| 8,405,147 B2 | 3/2013 | Brindle et al. |
| 8,451,044 B2 | 5/2013 | Nisbet et al. |
| 8,461,903 B1 | 6/2013 | Granger-Jones |
| 8,481,372 B2 | 7/2013 | Mouli |
| 8,487,706 B2 | 7/2013 | Li |
| 8,525,272 B2 | 9/2013 | Losehand et al. |
| 8,527,949 B1 | 9/2013 | Pleis et al. |
| 8,583,111 B2 | 11/2013 | Burgener et al. |
| 8,587,361 B2 | 11/2013 | Taddiken et al. |
| 8,604,864 B2 | 12/2013 | Ranta et al. |
| 8,638,159 B2 | 1/2014 | Ranta et al. |
| 8,669,804 B2 | 3/2014 | Ranta et al. |
| 8,729,949 B2 | 5/2014 | Nisbet et al. |
| 8,742,502 B2 | 6/2014 | Brindle et al. |
| 8,954,902 B2 | 2/2015 | Stuber et al. |
| 8,970,278 B2 | 3/2015 | Granger-Jones et al. |
| 9,024,700 B2 | 5/2015 | Ranta |
| 9,087,899 B2 | 7/2015 | Brindle et al. |
| 9,106,227 B2 | 8/2015 | Ranta et al. |
| 9,129,836 B2 | 9/2015 | Losehand et al. |
| 9,130,564 B2 | 9/2015 | Brindle et al. |
| 9,190,994 B2 | 11/2015 | Hurwitz |
| 9,197,194 B2 | 11/2015 | Reedy et al. |
| 9,209,801 B2 | 12/2015 | Matsuno |
| 9,225,378 B2 | 12/2015 | Burgener et al. |
| 9,276,570 B2 | 3/2016 | Madan et al. |
| 9,293,262 B2 | 3/2016 | Bawell et al. |
| 9,397,656 B2 | 7/2016 | Dribinsky et al. |
| 9,438,223 B2 | 9/2016 | de Jongh |
| 9,496,849 B2 | 11/2016 | Ranta et al. |
| 9,608,619 B2 | 3/2017 | Stuber et al. |
| 9,653,601 B2 | 5/2017 | Brindle et al. |
| 9,667,227 B2 | 5/2017 | Ranta |
| 9,667,244 B1 | 5/2017 | Cavus et al. |
| 9,742,400 B2 | 8/2017 | Bakalski et al. |
| 9,755,615 B2 | 9/2017 | Ranta et al. |
| 9,780,775 B2 | 10/2017 | Brindle et al. |
| 9,780,778 B2 | 10/2017 | Burgener et al. |
| 9,786,781 B2 | 10/2017 | Brindle et al. |
| 9,806,694 B2 | 10/2017 | Reedy et al. |
| 9,887,695 B2 | 2/2018 | Dribinsky et al. |
| 9,948,281 B2 | 4/2018 | Ranta |
| 10,050,616 B2 | 8/2018 | Ranta et al. |
| 10,056,895 B2 * | 8/2018 | Granger-Jones ..... H03K 17/102 |
| 10,153,763 B2 | 12/2018 | Brindle et al. |
| 10,153,767 B2 | 12/2018 | Burgener et al. |
| 10,158,285 B2 | 12/2018 | Emsenhuber |
| 10,236,872 B1 | 3/2019 | Willard et al. |
| 10,270,437 B2 | 4/2019 | Scott et al. |
| 10,320,379 B2 | 6/2019 | Kerr et al. |
| 10,505,530 B2 | 12/2019 | Ranta et al. |
| 10,505,895 B2 * | 12/2019 | Zeng ..................... H04L 45/02 |
| 10,523,195 B1 | 12/2019 | Luo et al. |
| 10,886,911 B2 | 1/2021 | Willard et al. |
| 2001/0015461 A1 | 8/2001 | Ebina |
| 2001/0031518 A1 | 10/2001 | Kim et al. |
| 2001/0040479 A1 | 11/2001 | Zhang |
| 2001/0045602 A1 | 11/2001 | Maeda et al. |
| 2002/0029971 A1 | 3/2002 | Kovacs |
| 2002/0115244 A1 | 8/2002 | Park et al. |
| 2002/0126767 A1 | 9/2002 | Ding et al. |
| 2002/0195623 A1 | 12/2002 | Horiuchi |
| 2003/0002452 A1 | 1/2003 | Sahota |
| 2003/0141543 A1 | 7/2003 | Bryant et al. |
| 2003/0160515 A1 | 8/2003 | Yu et al. |
| 2003/0181167 A1 | 9/2003 | Iida |
| 2003/0201494 A1 | 10/2003 | Maeda et al. |
| 2003/0205760 A1 | 11/2003 | Kawanaka et al. |
| 2003/0222313 A1 | 12/2003 | Fechner |
| 2003/0227056 A1 | 12/2003 | Wang et al. |
| 2004/0021137 A1 | 2/2004 | Fazan et al. |
| 2004/0051114 A1 | 3/2004 | Brindle |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2004/0218442 A1 | 11/2004 | Kirsch et al. |
| 2004/0227565 A1 | 11/2004 | Chen et al. |
| 2004/0242182 A1 | 12/2004 | Hikada et al. |
| 2005/0017789 A1 | 1/2005 | Burgener et al. |
| 2005/0077564 A1 | 4/2005 | Forbes |
| 2005/0079829 A1 | 4/2005 | Ogawa et al. |
| 2005/0121699 A1 | 6/2005 | Chen et al. |
| 2005/0127442 A1 | 6/2005 | Veeraraghavan |
| 2005/0167751 A1 | 8/2005 | Nakajima et al. |
| 2005/0179506 A1 | 8/2005 | Takahashi |
| 2005/0212595 A1 | 9/2005 | Kusunoki et al. |
| 2005/0264341 A1 | 12/2005 | Hikita et al. |
| 2006/0009164 A1 | 1/2006 | Kataoka |
| 2006/0022526 A1 | 2/2006 | Cartalade |
| 2006/0077082 A1 | 4/2006 | Shanks et al. |
| 2006/0118884 A1 | 6/2006 | Losehand et al. |
| 2006/0160520 A1 | 7/2006 | Miyazawa |
| 2006/0194558 A1 | 8/2006 | Kelly |
| 2006/0194567 A1 | 8/2006 | Kelly et al. |
| 2006/0199563 A1 | 9/2006 | Kelly et al. |
| 2006/0267093 A1 | 11/2006 | Tang et al. |
| 2007/0018247 A1 | 1/2007 | Brindle et al. |
| 2007/0023833 A1 | 2/2007 | Okhonin et al. |
| 2007/0045697 A1 | 3/2007 | Cheng et al. |
| 2007/0069291 A1 | 3/2007 | Stuber et al. |
| 2007/0120103 A1 | 5/2007 | Burgener et al. |

(56) References Cited

U.S. PATENT DOCUMENTS

| | | |
|---|---|---|
| 2007/0279120 A1 | 12/2007 | Brederlow et al. |
| 2007/0290744 A1 | 12/2007 | Adachi et al. |
| 2008/0034335 A1 | 2/2008 | Cheng et al. |
| 2008/0073719 A1 | 3/2008 | Fazan et al. |
| 2008/0076371 A1 | 3/2008 | Dribinsky et al. |
| 2008/0191788 A1 | 8/2008 | Chen et al. |
| 2008/0265978 A1 | 10/2008 | Englekirk |
| 2008/0303080 A1 | 12/2008 | Bhattacharyya |
| 2009/0007036 A1 | 1/2009 | Cheng et al. |
| 2009/0029511 A1 | 1/2009 | Wu |
| 2009/0117871 A1 | 5/2009 | Burgener et al. |
| 2009/0181630 A1 | 7/2009 | Seshita et al. |
| 2009/0278206 A1 | 11/2009 | Losehand et al. |
| 2010/0060377 A1 | 3/2010 | Takahashi |
| 2010/0308932 A1 | 12/2010 | Rangarajan |
| 2010/0327948 A1 | 12/2010 | Nisbet et al. |
| 2011/0001542 A1 | 1/2011 | Ranta et al. |
| 2011/0002080 A1 | 1/2011 | Ranta |
| 2011/0092179 A1 | 4/2011 | Burgener et al. |
| 2011/0127849 A1 | 6/2011 | Yoon |
| 2011/0163779 A1 | 7/2011 | Hidaka |
| 2011/0169550 A1 | 7/2011 | Brindle et al. |
| 2011/0227637 A1 | 9/2011 | Stuber et al. |
| 2011/0227666 A1 | 9/2011 | Manssen et al. |
| 2011/0260774 A1* | 10/2011 | Granger-Jones ..... H03K 17/102 327/427 |
| 2012/0169398 A1 | 7/2012 | Brindle et al. |
| 2012/0267719 A1 | 10/2012 | Brindle et al. |
| 2013/0015717 A1 | 1/2013 | Dykstra |
| 2013/0260698 A1 | 10/2013 | Nisbet et al. |
| 2013/0293280 A1 | 11/2013 | Brindle et al. |
| 2014/0001550 A1 | 1/2014 | Losehand et al. |
| 2014/0009211 A1 | 1/2014 | Madan |
| 2014/0009214 A1 | 1/2014 | Altunkilic |
| 2014/0055191 A1 | 2/2014 | Kim et al. |
| 2014/0118053 A1 | 5/2014 | Matsuno |
| 2014/0167834 A1 | 6/2014 | Stuber et al. |
| 2014/0179374 A1 | 6/2014 | Burgener et al. |
| 2014/0312422 A1 | 10/2014 | Brindle et al. |
| 2015/0015321 A1 | 1/2015 | Dribinsky et al. |
| 2015/0022256 A1 | 1/2015 | Sprinkle et al. |
| 2015/0270806 A1 | 9/2015 | Wagh |
| 2015/0364928 A1 | 12/2015 | Yen |
| 2015/0381171 A1 | 12/2015 | Cebi |
| 2016/0064561 A1 | 3/2016 | Brindle et al. |
| 2016/0191040 A1 | 6/2016 | Brindle et al. |
| 2016/0226478 A1 | 8/2016 | Dribinsky et al. |
| 2016/0329891 A1 | 11/2016 | Bakalski et al. |
| 2017/0134016 A1 | 5/2017 | Ranta |
| 2017/0162692 A1 | 6/2017 | Brindle et al. |
| 2017/0201248 A1 | 7/2017 | Scott |
| 2017/0236946 A1 | 8/2017 | Stuber et al. |
| 2017/0272066 A1 | 9/2017 | Scott |
| 2017/0338321 A1 | 11/2017 | Hurwitz |
| 2018/0061985 A1 | 3/2018 | Brindle et al. |
| 2018/0069530 A1 | 3/2018 | Ranta |
| 2018/0083614 A1 | 3/2018 | Brindle et al. |
| 2018/0114801 A1 | 4/2018 | Leipold |
| 2018/0175851 A1 | 6/2018 | Kerr |
| 2018/0212599 A1 | 7/2018 | Dribinsky et al. |
| 2019/0305767 A1 | 10/2019 | Ranta et al. |
| 2019/0305768 A1 | 10/2019 | Willard et al. |
| 2019/0305769 A1 | 10/2019 | Willard et al. |
| 2020/0119719 A1 | 4/2020 | Ranta |
| 2020/0153425 A1 | 5/2020 | Ranta |
| 2020/0321955 A1 | 10/2020 | Willard et al. |

FOREIGN PATENT DOCUMENTS

| | | |
|---|---|---|
| DE | 112011103554 | 9/2013 |
| EP | 385641 | 9/1990 |
| EP | 0622901 | 11/1994 |
| EP | 782267 | 7/1997 |
| EP | 0788185 | 8/1997 |
| EP | 0851561 | 1/1998 |
| EP | 913939 | 5/1999 |
| EP | 625831 | 11/1999 |
| EP | 1006584 | 6/2000 |
| EP | WO03032431 | 4/2003 |
| EP | 1925030 | 5/2008 |
| EP | 2348532 A2 | 7/2011 |
| EP | 2348533 A2 | 7/2011 |
| EP | 2348534 A2 | 7/2011 |
| EP | 2348535 A2 | 7/2011 |
| EP | 2348536 A2 | 7/2011 |
| EP | 2387094 | 11/2011 |
| EP | 2908435 | 8/2015 |
| EP | 3113280 | 1/2017 |
| EP | 1902474 | 4/2017 |
| JP | 55-75348 | 6/1980 |
| JP | S63-164352 | 7/1988 |
| JP | 1254014 | 10/1989 |
| JP | 02-161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | A-06-334506 | 12/1994 |
| JP | 7046109 | 2/1995 |
| JP | 07-070245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 8251012 | 9/1996 |
| JP | A-08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 9163721 | 6/1997 |
| JP | 09163721 | 6/1997 |
| JP | 09-200021 | 7/1997 |
| JP | 9181641 | 7/1997 |
| JP | 9186501 | 7/1997 |
| JP | 9200074 | 7/1997 |
| JP | 9238059 | 9/1997 |
| JP | 9243738 | 9/1997 |
| JP | 09-008621 | 10/1997 |
| JP | 09-284114 | 10/1997 |
| JP | 9270659 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10242826 | 9/1998 |
| JP | A-10-242829 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 3/2001 |
| JP | 2001-119281 | 4/2001 |

(56) References Cited

FOREIGN PATENT DOCUMENTS

| | | |
|---|---|---|
| JP | 2001157487 | 5/2001 |
| JP | 2001156182 | 6/2001 |
| JP | 2001-510006 | 7/2001 |
| JP | 2001274265 | 10/2001 |
| JP | 2002-033660 | 1/2002 |
| JP | 2002-098712 | 4/2002 |
| JP | 2004515937 | 5/2002 |
| JP | 2000358775 | 6/2002 |
| JP | 2003060451 | 2/2003 |
| JP | 2003101407 | 4/2003 |
| JP | 2003-516083 | 5/2003 |
| JP | 2003143004 | 5/2003 |
| JP | 2003167615 | 6/2003 |
| JP | 2003189248 | 7/2003 |
| JP | 2003332583 | 11/2003 |
| JP | 2003-347553 | 12/2003 |
| JP | 2002156602 | 12/2003 |
| JP | 2004-147175 | 5/2004 |
| JP | 2004166470 | 6/2004 |
| JP | 2004199950 | 7/2004 |
| JP | 2004288978 | 10/2004 |
| JP | 2005-203643 | 7/2005 |
| JP | 2005-251931 | 9/2005 |
| JP | 5215850 | 3/2013 |
| JP | 5678106 | 1/2015 |
| JP | 6006219 | 9/2016 |
| JP | 6026654 | 10/2016 |
| KR | 1994027615 | 12/1994 |
| WO | WO86/01037 | 2/1986 |
| WO | WO9523460 | 8/1995 |
| WO | WO9806174 | 2/1998 |
| WO | WO9935695 | 7/1999 |
| WO | WO99/49565 | 9/1999 |
| WO | WO01/41306 | 6/2001 |
| WO | WO0227920 | 4/2002 |
| WO | WO2006038190 | 4/2006 |
| WO | WO2007/008934 A1 | 1/2007 |
| WO | WO2007/035610 A2 | 3/2007 |
| WO | WO2007033045 A2 | 3/2007 |
| WO | 2009/108391 | 9/2009 |
| WO | 2009108391 | 9/2009 |
| WO | WO2012054642 | 4/2012 |
| WO | 2017066352 | 4/2017 |
| WO | 2019191140 | 10/2019 |

OTHER PUBLICATIONS

Marenk, et al., "Layout Optimization of Cascode RF SOI Transistors", IEEE International SOI Conference, 2001, pp. 105-106.
Suematsu, et al., "L-Band Internally Matched Si-MMIC Front End", IEEE, 1996, pp. 2375-2378.
Iyama, et al., "L-Band SPDT Switch Using Si-MOSFET", IEICE Trans. Electron, vol. E79-C, No. 5, May 1996, pp. 636-643.
Caverly, "Linear and Nonlinear Characteristics of the Silicon CMOS Monolithic 50-Omega Microwave and RF Control Element", IEEE Journal of Solid-State Circuits, 1999, pp. 124-126.
Adan, et al., "Linearity and Low Noise Performance of SOIMOSFETs for RF Applications", IEEE International SOI Conference, 2000, pp. 30-31.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multifinger AlGaN/GaN MOSHFETs", University of South Carolina Scholar Commons, 2002, pp. 449-451.
Abidi, "Low Power Radio Frequency IC's for Portable Communications", IEEE, 1995, pp. 544-569.
De La Houssaye, et al., "Microwave Performance of Optically Fabricated T-Gate Thin Film Silicon on Sapphire Based MOSFET's", IEEE Electron Device Letters, 1995, pp. 289-292.

Shifrin, et al., "Monolithic FET Structure for HighPower Control Component Applications", IEEE Transactions on Microwave Theory and Techniques, 1989, pp. 2134-2142.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
McGrath, et al., "Novel High Performance SPDT Power Switches Using Multi-Gate FET's", IEEE, 1991, pp. 839-842.
Luu, Office Action from the USPTO dated Oct. 2008 relating to U.S. Appl. No. 11/351,342.
Chow, Office Action from the USPTO dated Aug. 2010 relating to U.S. Appl. No. 11/347,671.
Suematsu, "On-Chip Matching SI-MMIC for Mobile Communication Terminal Application", IEEE, 1997, pp. 9-12.
Caverly, et al., "On-State Distortion in High Electron Mobility Transistor Microwave and RF Switch Control Circuits", IEEE Transactions on Microwave Theory and Techniques, 2000, pp. 98-103.
"Radiation Hardened CMOS Dual DPST Analog Switch", Intersil, 1999, pp. 1-2.
Newman, "Radiation Hardened Power Electronics", Intersil Corporation, 1999, pp. 1-4.
Huang, et al., "TFSOI Can It Meet the Challenge of Single Chip Portable Wireless Systems", IEEE International SOI Conference, 1997, pp. 1-3.
Devlin, "The Design of Integrated Switches and Phase Shifters", 1999.
Hess, et al., "Transformerless Capacitive Coupling of Gate Signals for Series Operation of Power MOS Devices", IEEE, 1999, pp. 673-675.
"UPG13xG Series L-Band SPDT Switch GaAs MMIC", NEC, 1996, pp. 1-30.
Reedy, et al., "UTSi CMOS: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.
Wang, et al., "Efficiency Improvement in Charge Pump Circuits", IEEE Journal of Solid-State Circuits, vol. 32, No. 6, Jun. 1997, pp. 852-860.
Kelly, Response to Office Action mailed to USPTO relating to U.S. Appl. No. 11/351,342 dated Jan. 30, 2009.
"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Botto, et al., "Series Connected Soft Switched IGBTs for High Power, High Voltage Drives Applications: Experimental Results", IEEE, 1997, pp. 3-7.

(56) References Cited

OTHER PUBLICATIONS

Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Reedy, et al., "Single Chip Wireless Systems Using SOI", IEEE International SOI Conference, 1999, pp. 8-11.
Stuber, et al., "SOI CMOS with High Performance Passive Components for Analog, RF and Mixed Signal Designs", IEEE International SOI Conference, 1998, pp. 99-100.
Fukuda, et al., "SOI CMOS Device Technology", Special Edition on 21st Century Solutions, 2001, pp. 54-57.
Kusunoki, et al., "SPDT Switch MMIC Using E/D Mode GaAs JFETs for Personal Communications", IEEE GaAs IC Symposium, 1992, pp. 135-138.
Wells, Kenneth B., Notice of Allowance received from the USPTO dated Feb. 28, 2020 for U.S. Appl. No. 16/261,167, 11 pgs.
Wells, Kenneth B., Office Action received from the USPTO dated Apr. 22, 2020 for U.S. Appl. No. 16/682,920, 154 pgs.
Wells, Kenneth B., Final Office Action received from the USPTO dated Jul. 29, 2020 for U.S. Appl. No. 16/682,920, 20 pgs.
Wells, Kenneth B., Notice of Allowance received from the USPTO dated Sep. 10, 2020 for U.S. Appl. No. 16/682,920, 7 pgs.
Wells, Kenneth B., Office Action received from the USPTO dated Oct. 16, 2020 for U.S. Appl. No. 16/852,804, 220 pgs.
Chen, Patrick C., Final Office Action received from the USPTO dated Oct. 21, 2020 for U.S. Appl. No. 16/653,728, 26 pgs.
Tra, Anh Quan, Office Action received from the USPTO dated May 8, 2019 for U.S. Appl. No. 15/939,132, 143 pgs.
Tra, Anh Quan, Notice of Allowance received from the USPTO dated Aug. 13, 2019 for U.S. Appl. No. 15/939,132, 18 pgs.
Tra, Anh Quan, Notice of Allowance received from the USPTO dated Nov. 4, 19 for U.S. Appl. No. 15/939,132, 11 pgs.
Tra, Anh Quan, Office Action received from the USPTO dated Mar. 20, 2020 for U.S. Appl. No. 15/939,132, 11 pgs.
Tra, Anh Quan, Office Action received from the USPTO dated Jul. 2, 2020 for U.S. Appl. No. 15/939,132, 15 pgs.
Tra, Anh Quan, Advisory Action received from the USPTO dated Sep. 11, 2020 for U.S. Appl. No. 15/939,132, 3 pgs.
Tra, Anh Quan, Notice of Allowance received from the USPTO dated Nov. 18, 2020 for U.S. Appl. No. 15/939,132, 13 pgs.
Psemi Corporation, Response filed in the USPTO dated Jul. 26, 2019 for U.S. Appl. No. 15/939,132, 10 pgs.
Psemi Corporation, Response filed in the USPTO dated Jun. 22, 2020 for U.S. Appl. No. 15/939,132, 9 pgs.
Psemi Corporation, Response filed in the USPTO dated Sep. 1, 2020 for U.S. Appl. No. 15/939,132, 9 pgs.
Psemi Corporation, Response filed in the USPTO dated Oct. 30, 2020 for U.S. Appl. No. 15/939,132, 4 pgs.
Chen, Patrick C., Final Office Action received from the USPTO dated Dec. 13, 2018 for U.S. Appl. No. 15/871,643, 24 pgs.
Peregrine Semiconductor Corporation, Response filed in the EPO dated Sep. 6, 2016 for U.S. Appl. No. 16/020,116 6, 2 pgs.
Nguyen, Niki Hoang, Notice of Allowance received from the USPTO dated Sep. 23, 2016 for U.S. Appl. No. 14/804,198, 21 pgs.
Tieu, Binh Kien, Office Action received from the USPTO dated Oct. 4, 2016 for U.S. Appl. No. 14/883,499, 23 pgs.
Chiquero, S. Sanchez, Minutes of the Oral Proceedings received from the EPO dated Oct. 10, 2016 for appln. No. 06786943.8, 25 pgs.
Brindle, et al., Response filed in the USPTO dated Oct. 28, 2016 for U.S. Appl. No. 14/845,154, 9 pgs.
Chiquero, S. Sanchez, Datasheet for the Decision of Sep. 29, 2016 received from the EPO for appln. No. 06786943.8, 15 pgs.

Unterberger, Michael, Extended Search Report received from the EPO dated Dec. 6, 2016 for appln. No. 16020116.6, 10 pgs.
Nguyen, Niki Hoang, Notice of Allowance received from the USPTO dated Dec. 7, 2016 for U.S. Appl. No. 14/804,198, 12 pgs.
Hoffman, et al., Communication under Rule 71(3) received from the EPO dated Dec. 1, 2016 for appln. No. 06786943.8, 4 pgs.
Burgener, et al., Response to Non-Final Office Action filed in the USPTO dated Feb. 3, 2017 for U.S. Appl. No. 14/883,499, 8 pgs.
Brindle, et al., Preliminary Amendment filed in the USPTO dated Feb. 23, 2017 for U.S. Appl. No. 15/354,723, 7 pgs.
Nguyen, Niki Hoang, Final Office Action received from the USPTO dated Mar. 8, 2017 for U.S. Appl. No. 14/845,154, 28 pgs.
Nguyen, Niki Hoang, Office Action received from the USPTO dated Mar. 24, 2017 for U.S. Appl. No. 15/354,723, 15 pgs.
Brindle, et al., Response to Final Office Action filed in the USPTO dated Mar. 24, 2017 for U.S. Appl. No. 14/845,154, 3 pgs.
Nguyen, Niki Hoang, Notice of Allowance received from the USPTO dated Apr. 10, 2017 for U.S. Appl. No. 14/845,154, 8 pgs.
Brindle, et al., Response filed in the USPTO dated Apr. 17, 2017 for U.S. Appl. No. 15/354,723, 9 pgs.
Tieu, Binh Kien, Final Office Action received from the USPTO dated May 18, 2017 for U.S. Appl. No. 14/883,499, 19 pgs.
Burgener, et al., Response filed in the USPTO dated May 26, 2017 for U.S. Appl. No. 14/883,499, 3 pgs.
Sukman-Pranhofer, Sibina, English translation of Office Action received from the German Patent Office for appln. No. 112011103554.3, 7 pgs.
Tieu, Binh Kien, Notice of Allowance received from the USPTO dated Jun. 8, 2017 for U.S. Appl. No. 14/883,499, 14 pgs.
Nguyen, Niki Hoang, Notice of Allowance received from the USPTO dated Jun. 21, 2017 for U.S. Appl. No. 15/354,723, 23 pgs.
Stuber, et al., Preliminary Amendment filed in the USPTO dated Jul. 21, 2017 for U.S. Appl. No. 15/419,898, 10 pgs.
Nguyen, Niki Hoang, Notice of Allowance received from the USPTO dated Aug. 9, 2017 for U.S. Appl. No. 14/845,154, 12 pgs.
Shingleton, Michael B., Notice of Allowance received from the USPTO dated Aug. 10, 2017 for U.S. Appl. No. 14/987,360, 49 pgs.
Nguyen, Niki Hoang, Notice of Allowance received from the USPTO dated Aug. 11, 2017 for U.S. Appl. No. 15/354,723, 18 pgs.
Itoh, et al., Office Action and English translation received from the JPO dated Jun. 27, 2017 for appln. No. 2016-175339, 14 pgs.
Burgener, et al., Preliminary Amendment filed in the USPTO dated Nov. 17, 2017 for U.S. Appl. No. 15/656,953, 7 pgs.
Brindle, et al., Preliminary Amendment filed in the USPTO dated Dec. 7, 2017 for U.S. Appl. No. 15/707,970, 9 pgs.
Nguyen, Niki Hoang, Office Action received from the USPTO dated Jan. 12, 2018 for U.S. Appl. No. 15/707,970, 11 pgs.
Tieu, Binh Kien, Office Action received from the USPTO dated Mar. 7, 2018 for U.S. Appl. No. 15/656,953, 14 pgs.
Nguyen, Niki Hoang, Office Action received from the USPTO dated Mar. 9, 2018 for U.S. Appl. No. 15/693,182, 10 ppgs.
Itoh, et al., English translation of Office Action received from the JPO dated Feb. 27, 2018 for appln. No. 2016-175339, 4 pgs.
Nguyen, Niki Hoang, Notice of Allowance received from the USPTO dated Apr. 2, 2018 for U.S. Appl. No. 15/707,970, 14 pgs.
Tieu, Binh Kien, Final Office Action received from the USPTO dated May 16, 2018 for U.S. Appl. No. 15/656,953, 12 pgs.
Tat, Binh, Office Action received from the USPTO dated Jun. 4, 2018 for U.S. Appl. No. 15/419,898, 39 pgs.
Nguyen, Niki Hoang, Notice of Allowance received from the USPTO dated Jun. 21, 2018 for U.S. Appl. No. 15/693,182, 22 pgs.
Nguyen, Niki Hoang, Notice of Allowance received from the USPTO dated Jul. 2, 2018 for U.S. Appl. No. 15/707,970, 19 pgs.
Toeu. Binh Kien, Notice of Allowance received from the USPTO dated Aug. 1, 2018 for U.S. Appl. No. 15/656,953, 13 pgs.
Schaper, "Communications, Computations, Control, and Signal Processing", Kluwer Academic, 1997.
Willert-Porada, "Advanced in Microwave and Radio Frequency Processing", Spring, 2001.
"An Ultra-Thin Silicon Technology that Provides Integration Solutions on Standard CMOS", Peregrine Semiconductor, 1998.
Caverly, "Distortion in Microwave Control Devices", 1997.

(56) References Cited

OTHER PUBLICATIONS

Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hillile Microwave, 1995.
Uda, "Miniturization and High Isolation of a GaAs SPDT Switch IC Mounted in Plastic Package", 1996.
Marshall, et al., "SOI Design: Analog, Memory, and Digital Techniques", Kluwer Academic Publishers, 2002.
Bernstein, et al., "SOI Circuit Design Concepts", Springer Science + Business Media, 2000.
Brinkman, et al., Respondents' Notice of Prior Art, Investigation No. 337-TA-848, dated Aug. 31, 2012, 59 pgs.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999.
Stuber, et al., Supplemental Amendment filed in the USPTO dated Nov. 8, 2012 for related U.S. Appl. No. 13/028,144, 17 pgs.
Brindle, et al., Response and Terminal Disclaimer filed in the USPTO dated Dec. 26, 2012 for related U.S. Appl. No. 13/277,108, 18 pgs.
Nguyen, Tram Hoang, Notice of Allowance received from the USPTO dated Nov. 12, 2010 for U.S. Appl. No. 11/484,370, 21 pgs.
Suehle, et al., "Low Electric Field Breakdown of Thin Si02 Films Under Static and Dynamic Stress", IEEE Transactions on Electron Devices, vol. 44, No. 5, May 1997.
Hoffmann, N., Summons to Attend Oral Proceedings pursuant to Rule 115(1) EPC received from the EPO dated Jul. 22, 2011 for related appln. No. 06786943.8, 8 pgs.
Shingleton, Michael B., Advisory Action received from the USPTO dated Mar. 18, 2011 for related U.S. Appl. No. 11/881,816, 3 pgs.
Shingletom, Michael B., Interview Summary received from the USPTO dated Apr. 18, 2011 for related U.S. Appl. No. 11/881,816, 3 pgs.
Nguyen, Tram Hoang, Examiner Amendment received from the USPTO dated Nov. 1, 2010 for related U.S. Appl. No. 11/484,370, 7 pgs.
Peregrine Semiconductor Corporation, Reply filed in the EPO dated Oct. 24, 2011 for related appln. No. 06786943.8, 1 pg.
Chinese Patent Office, a translation of a Chinese Office Action dated Nov. 2, 2011 for related appln. No. 200680025128.7, 12 pgs.
Juhl, Andreas, Decision to refuse a European patent application received from the EPO dated Nov. 18, 2011 for related appln. No. 06786943.8-1528, 4 pgs.
Tat, Binh C., Office Action received from the USPTO dated Jan. 18, 2012 for related U.S. Appl. No. 13/028,144, 33 pgs.
Peregrine Semiconductor Corporation, Response to Communication filed in the EPO dated Aug. 12, 2009 for related application No. 06786943,8, 31 pgs.
Iperione, Analia, International Search Report and Written Opinion received from the EPO dated Nov. 7, 2006 for related appln. No. PCT/US2006/026965, 19 pgs.
Geier, Adolf, International Preliminary Report on Patentability received from the EPo dated Jun. 21, 2007 for related appln. No. PCT/US2006/026965, 12 pgs.
Stuber, et al., Proposed Amended Claims for Examiner's Consideration filed in the USPTO dated Aug. 27, 2010 for related U.S. Appl. No. 11/520,912, 11 pgs.
Stuber, et al., Comments on Examiner's Statement of Reasons for Allowance filed in the USPTO dated Dec. 15, 2010 for related U.S. Appl. No. 11/520,912, 5 pgs.
Huang, "A 0.5 um CMOS T/R Switch for 900-MHz Wireless Applications"; IEEE Journal of Solid-State Circuits, vol. 36, No. 3, Mar. 2001, pp. 486-492.
Lauterbach, et al. "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.

Makioka, et al., "Super Self-Aligned GaAs RF Switch IC with 0.25 dB Extremely Low Insertion Loss for Mobile Communication Systems", IEEE Transactions on Electron Devices, vol. 48, No. 8, Aug. 2001, pp. 1510-1514.
Tieu, Binh, Office Action received from the USPTO dated Jun. 3, 2005 for related U.S. Appl. No. 10/922,135, 8 pgs.
Rodgers, et al., "Silicon UTSi COMS RFIC for CDMA Wireless Communications Systems", Peregrine Semiconductor Corporation, 1999 IEEE MTT-S Digest, p. 485-488.
Megahed, et al., "Low Cost UTSI Technology for RF Wireless Applications", Peregrine Semiconductor Corporation, 1998 IEEE MTT-S Digest p. 981-984.
Burgener, et al., Amendment filed in the USPTO dated Dec. 5, 2005 for related U.S. Appl. No. 10/922,135, 7 pgs.
Burgener, CMOS SOS Switched Offer Useful Features, High Integration, CMOS SOS Switches, Microwaves & RF, Aug. 2001, p. 107-118.
Johnson, et al., "Advanced Thin-Film Silicon-on-Sapphire Technology: Microwave Circuit Applications", IEEE Transactions on Electron Devices, vol. 45, No. 5, May 1998, pp. 1047-1054.
Miyajima, Notice of Reasons for Refusal received from the Japanese Patent Office for appln. No. 2003-535287 dated Feb. 13, 2006, 3 pgs.
Tieu, Binh, Office Action received from USPTO dated Jan. 17, 2006 for related U.S. Appl. No. 10/922,135, 8 pgs.
Burgener, Response filed in the UPSTO including Terminal Disclaimer dated May 16, 2006 for U.S. Appl. No. 10/922,135, 3 pgs.
Tieu, Binh, Notice of Allowance received from the USPTO dated Jun. 2, 2006 for related U.S. Appl. No. 10/922,135, 5 pgs.
Tieu, Binh, Notice of Allowance received from the USPTO dated May 12, 2004 for related U.S. Appl. No. 10/267,531, 7 pgs.
Burgener, et al., Comments on Examiner's Statement of Reasons for Allowance dated 8/12/004 for related U.S. Appl. No. 10/267,531, 2 pgs.
Dribinsky, et al., Response filed in the USPTO dated Jan. 7, 2009 for related U.S. Appl. No. 11/881,816, 7 pgs.
Weman, Eva, Communication under Rule 71(3) EPC and Annex Form 2004 received from the European Patent Office for related appln. No. 02800982.7 dated Nov. 27, 2009, 68 pgs.
Kelly, Dylan, et al., Response and Terminal Disclaimers filed in the USPTO for related U.S. Appl. No. 11/347,014, dated Mar. 16, 2010, 10 pgs.
Dribinsky, et al., Response filed in the USPTO for related U.S. Appl. No. 11/881,816, dated Jul. 19, 2010, 22 pgs.
Tieu, Binh Kien, Notice of Allowance received from the USPTO for related U.S. Appl. No. 11/347,014, dated Apr. 29, 2010, 12 pgs.
Shingleton, Michael B., Office Action received from the USPTO dated Oct. 14, 2010 for related U.S. Appl. No. 11/881,816, 15 pgs.
Dribinsky, et al., Response filed in the USPTO dated Jan. 14, 2011 for related U.S. Appl. No. 11/881,816, 19 pgs.
Shifrin, Mitchell B., "Monolithic FET Structures for High-Power Control Component Applications", IEEE Transactions on Microwave Theory and Techniques, vol. 37, No. 12, Dec. 1989, pp. 2134 2141.
Miyajima, Ikumi, Notice of Reasons for Refusal received from the JPO dated Oct. 5, 2006 for related appln. No. 2003-535287, 4 pgs.
Tieu, Binh Kien, Office Action received from the USPTO dated Nov. 15, 2007 for related U.S. Appl. No. 11/582,206, 9 pgs.
Dinh, Le T., International Search Report received from the USRO dated Mar. 28, 2003 for related appln No. PCT/US02/32266, 2 pgs.
Burgener, et al., Amendment filed in the USPTO dated May 15, 2008 for related U.S. Appl. No. 11/582,206, 14 pgs.
Tieu, Binh Kien, Notice of Allowance received in the USPTO dated Jul. 15, 2008 for related U.S. Appl. No. 11/582,206, 7 pgs.
Van der Peet, H., Communication Pursuant to Article 94(3) EPC received from the EPO in related appln. No. 02800982.7-2220, dated Jun. 19, 2008, 3 pgs.
Caverly, Robert H., "A Silicon CMOS Monolithic RF and Microwave Switching Element", 1997 European Microwave Conference, Jerusalem, Sep. 1987, 4 pgs.
Van Der Peet, H., Communication pursuant to Article 94(3) EPC for related application No. 02800982.7-2220 dated Mar. 6, 2009, 2 pgs.

(56) References Cited

OTHER PUBLICATIONS

Tieu, Binh Kien, Office Action received from the USPTO dated Sep. 16, 2009 for related U.S. Appl. No. 11/347,014, 26 pgs.
Shingleton, Michael B, Notice of Allowance received from the USPTO for related U.S. Appl. No. 11/881,816, dated Oct. 12, 2011, 5 pgs.
Tieu, Binh Kien, Notice of Allowance received from the USPTO dated Aug. 11, 2010 for related U.S. Appl. No. 12/315,395, 26 pgs.
Kelly, et al., Comments on Examiner's Statement of Reasons for Allowance filed in the USPTO dated Jul. 29, 2010 for related U.S. Appl. No. 11/347,014, 2 pgs.
Chow, Charles Chiang, Office Action received from the USPTO dated Aug. 19, 2008 for related U.S. Appl. No. 11/347,671, 14 pgs.
Kelly, Dylan, Amendment filed in the USPTO dated Dec. 19, 2008 for related U.S. Appl. No. 11/347,671, 12 pgs.
Chow, Charles Chiang, Office Action received from the USPTO dated Apr. 16, 2009 for related U.S. Appl. No. 11/347,671, 16 pgs.
Kelly, Dylan, Response filed in the USPTO dated Jun. 16, 2009 for related U.S. Appl. No. 11/347,671, 14 pgs.
Chow, Chades Chiang, Office Action received from the USPTO dated Jul. 20, 2009 for related U.S. Appl. No. 11/347,671, 17 pgs.
Kelly, Dylan, Amendment filed in the USPTO dated Jan. 20, 2010 for related U.S. Appl. No. 11/347,671, 18 pgs.
Chow, Chades Chiang, Office Action received from the USPTO dated Apr. 28, 2010 for related U.S. Appl. No. 11/347,671, 20 pgs.
Kelly, Dylan, Amendment filed in the USPTO dated Jul. 28, 2010 for related U.S. Appl. No. 11/347,671, 6 pgs.
Chow, Charles Chiang, Office Action received from the USPTO dated Aug. 20, 2010 for related U.S. Appl. No. 11/347,671, 18 pgs.
Kelly, Dylan, Amendment filed in the USPTO dated Dec. 20, 2010 for related U.S. Appl. No. 11/347,671, 12 pgs.
Chow, Charles Chiang, Office Action received from the USPTO dated Mar. 2, 2011 for related U.S. Appl. No. 11/347,671, 15 pgs.
Kelly, Dylan, Amendment filed in the USPTO dated May 2, 2011 for related U.S. Appl. No. 11/347,671, 6 pgs.
Chow, Charles Chiang, Advisory Action received from the USPTO dated May 12, 2011 for related U.S. Appl. No. 11/347,671, 3 pgs.
Kelly, Dylan, Notice of Appeal filed in the USPTO dated Jun. 2, 2011 for related U.S. Appl. No. 11/347,671, 6 pgs.
Chow, Charles Chiang, Notice of Panel Decision from Pre-Appeal Brief Review dated Jul. 11, 2011 for related U.S. Appl. No. 11/347,671, 2 pgs.
Kelly, Dylan, Supplemental Amendment filed in the USPTO dated Aug. 9, 2011 for related U.S. Appl. No. 11/347,671, 3 pgs.
Chow, Charles Chiang, Notice of Allowance dated Aug. 16, 2011 for related U.S. Appl. No. 11/347,671, 12 pgs.
Nguyen, Tram Hoang, Notice of Allowance received from the USPTO dated Nov. 17, 2011, 41 pgs.
Hoffmann, Niels, International Search Report received from the EPO dated Feb. 27, 2012, 12 pgs.
Iijima, M, et al., "Boosted Voltage Scheme with Active Body-Biasing Control on PD-SOI for Ultra Low Voltage Operation", IEICE Transactions on Electronics, Institute of Electronics, vol. E90C, No. 4, Apr. 1, 2007, pp. 666-674.
Peregrine Semiconductor Corporation, Response filed in the EPO dated Jan. 17, 2012 for related appln. No. 06786943.8, 1 pg.
Peregrine Semiconductor Corporation, Appeal to the Decision for Refusal filed in the EPO dated Mar. 20, 2012 for related appln No. 06786943.1, 27 pgs.
Peregrine Semiconductor Corporation, Response filed in the EPO dated May 16, 2011 for related appln No. 11153227.1, 5 pgs.
Hoffman, Niels, Extended Search Report received from the EPO dated May 4, 2012 for related appln No. 11153227.1, 4 pgs.
Peregrine Semiconductor Corporation, Response filed in the EPO dated May 16, 2011 for related appln No. 11153247.9, 6 pgs.
Hoffman, Niels, Extended Search Report received from the EPO dated May 7, 2012 for related appln No. 111153247.9, 4 pgs.
Peregrine Semiconductor Corporation, Response filed in the EPO dated May 16, 2011 for related appln No. 11153241.2, 5 pgs.
Hoffman, Niels, Extended Search Report received from the EPO dated May 7, 2012 for related appln. No. 11153241.2, 4 pgs.
Hoffman, Niels, Extended Search Report received from the EPO dated May 8, 2012 for related appln. No. 11153281.8, 4 pgs.
Peregrine Semiconductor Corporation, Response filed in the EPO dated May 16, 2011 for related appln No. 11153313.9, 8 pgs.
Chen, et al., "Low Power, Multi-Gigabit DRAM Cell Design Issues Using SOI Technologies", http://bwrc.eecs.berkeley.edu/people/grad_students/chenff/reports, May 1999.
Pelella, et al., "Low-Voltage Transient Bipolar Effect Induced by Dynamic Floating-Body Charging in Scaled PD/SOI MOSFET's", IEEE Electron Device Letters, vol. 17, No. 5, May 1996.
Wei, "Measurement and Modeling of Transient Effects in Partially Depleted SOI MOSFETs", M.S. Thesis, MIT, Jul. 1996.
Shoucair, "Modeling, Decoupling and Supression of MOSFET Distortion Components", IEEE Proceeding Circuit Devices Systems, vol. 146, No. 1, Feb. 1999.
Shahidi, et al., "Partially Depleted SOI Technology for Digital Logic", IEEE Int'l Solid-State Circuits Conference, 1999, pp. 426-427.
Giffard, et al., "Dynamic Effects in SOI MOSFET's", IEEE 1991, pp. 160-161.
Numata, et al., "A +2.4/0 V Controlled High Power GaAs SPDT Antenna Switch IC for GSM Application", IEEE Radio Frequency Integrated Circuits Symposium, 2002, pp. 141-144.
Tinella, et al., "A 0.7dB Insertion Loss CMOS-SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs MMIC with Low-Distortion Cascade FET Mixer for Personal Handy-Phone System Terminals", IEEE, 1998, pp. 101-104.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.
Gu, et al., "A 2.3V PHEMT Power SP3T Antenna Switch IC for GSM Handsets", IEEE GaAs Digest, 2003, pp. 48-51.
Darabi, et al., "A 2.4GHz CMOS Transceiver for Bluetooth", IEEE, 2001, pp. 89-92.
Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Huang, et al., "A 900-MHz T/R Switch with a 0.8-dB Insertion Loss Implemented in a 0.5-um CMOS Process", IEEE Custom Integrated Circuits Conference, 2000, pp. 341-344.
Valeri, et al., "A Composite High Voltage Device Using Low Voltage SOI MOSFET's", IEEE, 1990, pp. 169-170.
Miyatsuji, et al., "A GaAs High Power RF Single Pole Double Throw Switch IC for Digital Mobile Communication System", IEEE International Solid-State Circuits Conference, 1994, pp. 34-35.

(56) References Cited

OTHER PUBLICATIONS

Miyatsuji, et al., "A GaAs High Power RF Single Pole Dual Throw Switch IC for Digital Mobile Communication System", IEEE Journal of Solid-State Circuits, 1995, pp. 979-983.
Puechberty, et al., "A GaAs Power Chip Set for 3V Cellular Communications", 1994.
Yamamoto, et al., "A GaAs RF Transceiver IC for 1.9GHz Digital Mobile Communication Systems", ISSCC96, 1996, pp. 340-341, 469.
Choumei, et al., "A High Efficiency, 2V Single Supply Voltage Operation RF Front End MMIC for 1.9GHz Personal Handy Phone Systems", IEEE, 1998, pp. 73-76.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp. 173-176.
Gu, et al., "A High Performance GaAs SP3T Switch for Digital Cellular Systems", IEEE MTT-S Digest, 2001, pp. 241-244.
Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.
Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Giugni, "A Novel Multi-Port Microwave/Millimeter-Wave Switching Circuit", Microwave Conference, 2000.
Caverly, "A Project Oriented Undergraduate CMOS Analog Microelectronic System Design Course", IEEE, 1997, pp. 87-88.
Harjani, et al., "A Prototype Framework for Knowledge Based Analog Circuit Synthesis", IEEE Design Automation Conference, 1987, pp. 42-49.
DeRossi, et al., "A Routing Switch Based on a Silicon-on-Insulator Mode Mixer", IEEE Photonics Technology Letters, 1999, pp. 194-196.
Caverly, et al., "A Silicon CMOS Monolithic RF and Microwave Switching Element", 27th European Microwave Conference, 1997, pp. 1046-1051.
Valeri, et al., "A Silicon-on-Insulator Circuit for High Temperature, High-Voltage Applications", IEEE, 1991, pp. 60-61.
F. Hameau and O. Rozeau, "Radio-Frequency Circuits Integration Using CMOS SOI 0.25 μm Technology", 2002 RF IC Design Workshop Europe, Mar. 19-22, 2002, Grenoble, France.
O. Rozeau et al., "SOI Technologies Overview for Low-Power Low-Voltage Radio-Frequency Applications," Analog Integrated Circuits and Signal Processing, 25, pp. 93-114, Boston, MA, Kluwer Academic Publishers, Nov. 2000.
C. Tinella et al., "A High-Performance CMOS-SOI Antenna Switch for the 2.55-GHz Band, "IEEE Journal of Solid-State Circuits, vol. 38, No. 7, Jul. 2003.
H. Lee et al., "Analysis of body bias effect with PD-SOI for analog and RF applications," Solid State Electron., vol. 46, pp. 1169-1176, 2002.
J.-H. Lee, et al., "Effect of Body Structure on Analog Performance of SOI NMOSFETs," Proceedings, 1998 IEEE International SOI Conference, Oct. 5-8, 1998, pp. 61-62.
C. F. Edwards, et al., The Effect of Body Contact Series Resistance on SOI CMOS Amplifier Stages, IEEE Transactions on Electron Devices, vol. 44, No. 12, Dec. 1997 pp. 2290-2294.

S. Maeda, et al., Substrate-bias Effect and Source-drain Breakdown Characteristics in Body-tied Short-channel SOI MOSFET's, IEEE Transactions on Electron Devices, vol. 46, No. 1, Jan. 1999 pp. 151-158.
F. Assaderaghi, et al., "Dynamic Threshold-voltage MOSFET (DTMOS) for Ultra-low Voltage VLSI," IEEE Transactions on Electron Devices, vol. 44, No. 3, Mar. 1997, pp. 414-422.
G. O. Workman and J. G. Fossum, "A Comparative Analysis of the Dynamic Behavior of BTG/SOI MOSFETs and Circuits with Distributed Body Resistance," IEEE Transactions on Electron Devices, vol. 45, No. 10, Oct. 1998 pp. 2138-2145.
T.-S. Chao, et al., "High-voltage and High-temperature Applications of DTMOS with Reverse Schottky Barrier on Substrate Contacts," IEEE Electron Device Letters, vol. 25, No. 2, Feb. 2004, pp. 86-88.
Wei, et al., "Measurement of Transient Effects in SOI DRAM/SRAM Access Transistors", IEEE Electron Device Letters, vol. 17, No. 5, May 1996.
Kuang, et al., "SRAM Bitline Circuits on PD SOI: Advantages and Concerns", IEEE Journal of Solid-State Circuits, vol. 32, No. 6, Jun. 1997.
Sleight, et al., "Transient Measurements of SOI Body Contact Effectiveness", IEEE Electron Device Letters, vol. 19, No. 12, Dec. 1998.
Chung, et al., "SOI MOSFET Structure with a Junction-Type Body Contact for Suppression of Pass Gate Leakage", IEEE Transactions on Electron Devices, vol. 48, No. 7, Jul. 2001.
Lee, et al., "Effects of Gate Structures on the RF Performance in PD SOI MOSFETs", IEEE Microwave and Wireless Components Letters, vol. 15, No. 4, Apr. 2005.
Hirano, et al., "Impact of Actively Body-bias Controlled (ABC) SOI SRAM by using Direct Body Contact Technology for Low-Voltage Application" IEEE, 2003, pp. 2.4.1-2.4.4.
Lee, et al., "Harmonic Distortion Due to Narrow Width Effects in Deep sub-micron SOI-CMOS Device for analog-RF Applications", 2002 IEEE International SOI Conference, Oct. 2002.
Orndorff, et al., "CMOS/SOS/LSI Switching Regulator Control Device", ISSCC 78, Feb. 17, 1978, IEEE International Solid-State Circuits Conference, pp. 234-235 and 282.
Kuo, et al., "Low-Voltage SOI CMOS VLSI Devices and Circuits", 2001, Wiley Interscience, New York, XP001090589, pp. 57-60 and 349-354.
Tat, Binh C., International Search Report and Written Opinion received from USRO dated Jul. 3, 2008 for application No. PCT/US06/36240, 10 pgs.
Tat, Binh C., Office Action received from USPTO dated Sep. 15, 2008 for U.S. Appl. No. 11/520,912, 18 pgs.
Shingleton, Michael B., Office Action dated Oct. 7, 2008 received from the USPTO for U.S. Appl. No. 11/881,816, 4 pgs.
Hoffmann, Niels, Communication from the EPO dated Feb. 4, 2009 for appln No. 06786943.8, 7 pgs.
Stuber, Michael, et al., photocopy of an Amendment dated Mar. 16, 2009 filed in the USPTO for U.S. Appl. No. 11/520,912, 21 pages.
Shingleton, Michael B., Communication received from USPTO dated Apr. 28, 2009 for U.S. Appl. No. 11/881,816, 3 pgs.
Tat, Binh C., Office Action received from USPTO dated Jul. 8, 2009 for U.S. Appl. No. 11/520,912, 6 pgs.
Dribinsky, et al, Response filed in USPTO dated Aug. 28, 2009 for U.S. Appl. No. 11/881,816, 5 pgs.
Photocopy of a translation of an Office Action dated Jul. 31, 2009 for Chinese appln. No. 200680025128.7, 3 pages.
Stuber, Michael, et al., Photocopy of a Response that was filed in the UPSTO for U.S. Appl. No. 11/520,912, dated Sep. 8, 2009, 3 pgs.
Tat, Binh C., Office Action received from the USPTO dated Dec. 10, 2009 for U.S. Appl. No. 11/520,912, 19 pages.
Shingleton, Michael B., Office Action received from the USPTO dated Jan. 19, 2010 for U.S. Appl. No. 11/881,816, 16 pgs.
Brindle, Chris, et al., Translation of a Response filed in the Chinese Patent Office for appln No. 200680025128.7 dated Nov. 30, 2009, 3 pages.
Morena, Enrico, Supplementary European Search Report for appln. No. 06814836.0, dated Feb. 17, 2010, 8 pages.

(56) References Cited

OTHER PUBLICATIONS

Kuang, J.B., et al., "A Floating-Body Charge Monitoring Technique for Partially Depleted SOI Technology", Int. J. of Electronics, vol. 91, No. 11, Nov. 11, 2004, pp. 625-637.
Stuber, et al., Amendment filed in the USPTO for U.S. Appl. No. 11/520,912, dated Jun. 10, 2010, 25 pages.
Sedra, Adel A., et al., "Microelectronic Circuits", Fourth Edition, University of Toronto, Oxford University Press, 1982, 1987, 1991 and 1998, pp. 374-375.
Tat, Binh C., Notice of Allowance received from the USPTO for U.S. Appl. No. 11/520,912, dated Sep. 16, 2010, 13 pages.
Brindle, et al., Response filed in the EPO for application No. 06 814 836.0-1235 dated Oct. 12, 2010, 24 pages.
Nguyen, Tram Hoang, Office Action received from the USPTO dated Sep. 19, 2008 for U.S. Appl. No. 11/484,370, 7 pgs.
Brindle, et al., Response filed in the USPTO dated Jan. 20, 2009 for U.S. Appl. No. 11/484,370, 5 pgs.
Nguyen, Tram Hoang, Office Action received from the USPTO dated Apr. 23, 2009 for U.S. Appl. No. 11/484,370, 11 pgs.
Brindle, et al., Response filed in the USPTO dated Aug. 24, 2009 for U.S. Appl. No. 11/484,370, 5 pgs.
Nguyen, Tram Hoang, Office Action received from the USPTO dated Jan. 6, 2010 for U.S. Appl. No. 11/484,370, 46 pgs.
Brindle, et al., Amendment filed in the USPTO dated Jul. 6, 2010 for U.S. Appl. No. 11/484,370, 23 pgs.
Bolam, et al., "Reliability Issues for Silicon-on-Insulator", 2000 IEEE, IBM Microelectronics Division, pp. 6.4.1-6.4.4, 4 pgs.
Hu, et al., "A Unified Gate Oxide Reliability Model", IEEE 99CH36296, 37th Annual International Reliability Physics Symposium, San Diego, CA 1999, pp. 47-51.
Nguyen, Niki Hoang, Notice of Allowance received from the USPTO dated Aug. 20, 2014 for related U.S. Appl. No. 14/198,315, 11 pgs.
Tat, Binh C., Notice of Allowance received from the USPTO dated Oct. 1, 2014 for related U.S. Appl. No. 13/028,144, 15 pgs.
Stuber, et al., "Method and Apparatus Improving Gate Oxide Reliability by Controlling Accumulated Charge", patent application filed in the USPTO dated Jul. 22, 2013 for related U.S. Appl. No. 13/948,094, 132 pgs.
European Patent Office, Communication received from the EPO dated Aug. 14, 2014 for related appln. No. 02800982.7, 2 pgs.
Peregrine Semiconductor Corporation, Response filed in the EPO dated Oct. 14, 2014 for appln. No. 10011669.8, 30 pgs.
Tat, Binh C., Office Action received from the USPTO dated Jan. 2, 2015 for U.S. Appl. No. 13/948,094, 187 pgs.
Stuber, et al., Response/Amendment filed in the USPTO dated Oct. 23, 2014 for U.S. Appl. No. 13/948,094, 28 pgs.
Burgener, et al., Response filed in the USPTO dated Nov. 24, 2014 for U.S. Appl. No. 14/062,791, 10 pgs.
Tat, Binh C., Notice of Allowance received from the USPTO dated Dec. 5, 2014 for U.S. Appl. No. 13/028,144, 13 pgs.
Stuber, et al., Comments on Examiner's Statement of Reasons for Allowance filed in the USPTO dated Dec. 8, 2014 for U.S. Appl. No. 13/028,144, 4 pgs.
Tieu, Binh Kien, Notice of Allowance received from the USPTO dated Jan. 23, 2015 for U.S. Appl. No. 14/062,791, 8 pgs.
Brindle, et al., Notice of Allowance received from the USPTO dated Feb. 3, 2015 for U.S. Appl. No. 14/198,315, 10 pgs.
Stuber, et al., Response/Amendment filed in the USPTO dated Mar. 2, 2015 for U.S. Appl. No. 13/948,094, 11 pgs.
Tat, Binh C., Office Action received from the USPTO dated Mar. 27, 2015 for U.S. Appl. No. 13/948,094, 23 pgs.
Shingleton, Michael, Office Action received from the USPTO dated Apr. 10, 2015 for U.S. Appl. No. 14/257,808, 8 pgs.
Tieu, Binh Kien, Notice of Allowance received from the USPTO dated May 14, 2015 for U.S. Appl. No. 14/062,791, 211 pgs.
Nguyen, Niki, Office Action received from the USPTO dated Oct. 2, 2013 for U.S. Appl. No. 13/850,251, 22 pgs.
Nguyen, Niki, Office Action received from the USPTO dated Apr. 2, 2014 for U.S. Appl. No. 13/850,251, 9 pgs.
Nguyen, Niki, Final Office Action received from the USPTO dated Jan. 22, 2015 for U.S. Appl. No. 13/850,251, 245 pgs.
Nguyen, Niki, Notice of Allowance received from the USPTO dated Apr. 22, 2015 for U.S. Appl. No. 13/850,251, 22 pgs.
Brindle, et al., Comments on Examiner's Statement of Reasons for Allowance filed in the USPTO dated Jul. 22, 2015 for U.S. Appl. No. 13/850,251, 3 pgs.
Brindle, et al., Preliminary Amendment filed in the USPTO dated Jul. 19, 2013 for U.S. Appl. No. 13/850,251, 21 pgs.
Brindle, et al., Amendment filed in the USPTO dated Dec. 26, 2013 for U.S. Appl. No. 13/850,251, 22 pgs.
Brindle, et al., Amendment filed in the USPTO dated Oct. 2, 2014 for U.S. Appl. No. 13/850,251, 13 pgs.
Brindle, et al., Amendment filed in the USPTO dated Mar. 23, 2015 for U.S. Appl. No. 13/850,251, 14 pgs.
Stuber, et al., Response/Amendment and Terminal Disclaimers filed in the USPTO dated Jul. 27, 2015 for U.S. Appl. No. 13/948,094, 26 pgs.
Tieu, Binh Kien, Notice of Allowance received from the USPTO dated Sep. 4, 2015 for U.S. Appl. No. 14/062,791, 12 pgs.
Dribinsky, et al., Amendment filed in the USPTO dated Oct. 13, 2015 for U.S. Appl. No. 14/257,808, 19 pgs.
Tat, Binh, Final Office Action received from the USPTO dated Nov. 19, 2015 for U.S. Appl. No. 13/948,094, 34 pgs.
Unterberger, Michael, Communication under Rule 71(3) EPC dated Dec. 1, 2015 for appln. No. 10011669.8, 64 pgs.
Peregrine Semiconductor Corporation communication received from the EPO dated Dec. 3, 2015 for appln. No. 11153227.1, 2 pgs.
Peregrine Semiconductor Corporation communication received from the EPO dated Dec. 3, 2015 for appln. No. 11153247.9, 2 pgs.
Peregrine Semiconductor Corporation communication received from the EPO dated Dec. 3, 2015 for appln. No. 11153241.2, 3 pgs.
Peregrine Semiconductor Corporation communication received from the EPO dated Dec. 4, 2015 for appln. No. 11153281.8, 3 pgs.
Shingleton, Michael B., Notice of Allowance received from the USPTO dated Dec. 10, 2015 for U.S. Appl. No. 14/257,808, 176 pgs.
Itoh, Tadashige, et al., English translation of Office Action received from the JPO dated Dec. 1, 2015 for appln. No. 2013-535054, 3 pgs.
Nguyen, Niki Hoang, Office Action received from the USPTO dated Mar. 2, 2016 for U.S. Appl. No. 14/804,198, 5 pgs.
Brindle, et al., Response filed in the USPTO dated Jun. 2, 2016 for U.S. Appl. No. 14/804,198, 9 pgs.
Peregrine Semiconductor Corporation, English translation of Response filed in the JPO dated Mar. 31, 2016 for appln. No. 2013-535054, 7 pgs.
Peregrine Semiconductor Corporation, Response filed in the EPO dated Mar. 30, 2016 for appln. No. 11153227.1, 13 pgs.
Peregrine Semiconductor Corporation, Response filed in the EPO dated Mar. 30, 2016 for appln. No. 11153247.9, 13 pgs.
Peregrine Semiconductor Corporation, Response filed in the EPO dated Mar. 30, 2016 for appln. No. 11153241.2, 15 pgs.
Peregrine Semiconductor Corporation, Response filed in the EPO dated Mar. 30, 2016 for appln. No. 11153281.8, 13 pgs.
Peregrine Semiconductor Corporation, Reply to Summons to Attend Oral Proceedings filed in the EPO dated Apr. 15, 2016 for appln. No. 0678943.8, 26 pgs.
Hoffmann, Niels, Communication pursuant to Article 94(3) EPC received from the EPO dated May 13, 2016 for appln. No. 11153313. 9, 4 pgs.
Nguyen, Niki Hoang, Office Action received from the USPTO dated Jun. 1, 2016 for U.S. Appl. No. 14/845,154, 6 pgs.
Couch, "Digital and Analog Communication Systems", 2001, Prentice-Hall.
Couch, "Modern Communication Systems", Prentice-Hall, 1995.
Freeman, "Radio System Design for Telecommunications", Wiley, 1997.
Gibson, "The Communications Handbook", CRC Press, 1997.
Itoh, "RF Technologies for Low Power Wireless Communications", Wiley, 2001.
Ionescu, et al., "A Physical Analysis of Drain Current Transients at Low Drain Voltage in Thin Film SOI MOSFETs", Microelectronic Engineering 28 (1995), pp. 431-434.

(56) References Cited

OTHER PUBLICATIONS

Suh, et al., "A Physical Charge-Based Model for Non-Fully Depleted SOI MOSFET's and Its Use in Assessing Floating-Body Effects in SOI CMOS Circuits", IEEE Transactions on Electron Devices, vol. 42, No. 4, Apr. 1995, pp. 728-737.
Wang, et al., "A Robust Large Signal Non-Quasi-Static MOSFET Model for Circuit Simulation", IEEE 2004 Custom Integrated Circuits Conference, pp. 2-1-1 through 2-1-4.
Han, et al., "A Simple and Accurate Method for Extracting Substrate Resistance of RF MOSFETs", IEEE Electron Device Letters, vol. 23, No. 7, Jul. 2002, pp. 434-436.
Linear Systems, "High-Speed DMOS FET Analog Switches and Switch Arrays", 11 pgs.
Terauchi, et al., "A 'Self-Body-Bias' SOI MOSFET: A Novel Body-Voltage-Controlled SOI MOSFET for Low Voltage Applications", The Japan Sociey of Applied Physics, vol. 42 (2003), pp. 2014-2019, Part 1, No. 4B, Apr. 2003.
Dehan, et al., "Dynamic Threshold Voltage MOS in Partially Depleted SOI Technology: A Wide Frequency Band Analysis", Solid-State Electronics 49 (2005), pp. 67-72.
Kuroda, et al., "A 0.9-V, 150-MHz, 10-mW, 4 mm2, 2-D Discrete Cosine Transform Core Processor with Variable Threshold-Voltage (VT) Scheme", IEEE Journal of Solid-State Circuits, vol. 31, No. 11, Nov. 1996, pp. 1770-1779.
Kuroda, et al., "A 0.9-V, 150-MHz, 10-mW, 4 mm2, 2-D Discrete Cosine Transform Core Processor with Variable-Threshold-Voltage Scheme", Technical Paper, 1996 IEEE International Solid-State Circuits Conference, 1996 Digest of Technical Papers, pp. 166-167.
Cathelin, et al., "Antenna Switch Devices in RF Modules for Mobile Applications", ST Microelectronics, Front-End Technology and Manufacturing, Crolles, France, Mar. 2005, 42 pgs.
Cristoloveanu, Sorin, "State-of-the-art and Future of Silicon on Insulator Technologies, Materials, and Devices", Microelectronics Reliability 40 (2000), pp. 771-777.
Sivaram, et al., "Silicon Film Thickness Considerations in SOI-DTMOS", IEEE Device Letters, vol. 23, No. 5, May 2002, pp. 276-278.
Drake, et al., "Analysis of the Impact of Gate-Body Signal Phase on DTMOS Inverters in 0.13um PD-SOI", Department of EECS, University of Michigan, Ann Arbor, MI, Sep./Oct. 2003, 4 pgs.
Drake, et al., "Analysis of the Impact of Gate-Body Signal Phase on DTMOS Inverters in 0.13um PD-SOI", Department of EECS, University of Michican, Ann Arbor, MI, Sep./Oct. 2003, 16 pgs.
Drake, et al., Evaluation of Dynamic-Threshold Logic for Low-Power VLSI Design in 0.13um PD-SOI, University of Michigan, Ann Arbor, MI, Dec. 2003, 29 pgs.
Imam, et al., "A Simple Method to Determine the Floating-Body Voltage of SOI CMOS Devices", IEEE Electron Device Letters, vol. 21, No. 1, Jan. 2000, pp. 21-23.
Dehan, et al., "Alternative Architectures of SOI MOSFET for Improving DC and Microwave Characteristrics", Microwave Laboratory, Universite catholique de Louvain, Sep. 2001, 4 pgs.
Colinge, Jean-Pierre, "An SOI Voltage-Controlled Bipolar-MOS Device", IEEE Transactions on Electron Devices, vol. ED-34, No. 4, Apr. 1987, pp. 845-849.
Pelella, et al., "Analysis and Control of Hysteresis in PD/SOI CMOS", University of Florida, Gainesville, FL., 1999 IEEE, pp. 34.5.1 through 34.5.4.
Adriaensen, et al., "Analysis and Potential of the Bipolar- and Hybrid-Mode Thin-Film SOI MOSFETs for High-Temperature Applications", Laboratoire de Microelectronique, Universite catholique de Louvain, May 2001, 5 pgs.
Gentinne, et al., "Measurement and Two-Dimensional Simulation of Thin-Film SOI MOSFETs: Intrinsic Gate Capacitances at Elevated Temperatures", Solid-State Electronics, vol. 39, No. 11, pp. 1613-1619, 1996.
Su, et al., "On the Prediction of Geometry-Dependent Floating-Body Effect in SOI MOSFETs", IEEE Transactions on Electron Devices, vol. 52, No. 7, Jul. 2005, pp. 1662-1664.

Dehan, et al., "Partially Depleted SOI Dynamic Threshold MOSFET for low-voltage and microwave applications", 1 pg.
Fung, et al., "Present Status and Future Direction of BSIM SOIL Model for High-Performance/Low-Power/RF Application", IBM Microelectronics, Semiconductor Research and Development Center, Apr. 2002, 4 pgs.
Weigand, Christopher, "An ASIC Driver for GaAs FET Control Components", Technical Feature, Applied Microwave & Wireless, 2000, pp. 42-48.
Lederer, et al., "Frequency degradation of SOI MOS device output conductance", Microwave Laboratory of UCL, Belgium, IEEE 2003, pp. 76-77.
Lederer, et al., "Frequency degradation of SOI MOS device output conductance", Microwave Laboratory of Universite catholique de Louvain, Belgium, Sep./Oct. 2003, 1 pg.
Cheng, et al., "Gate-Channel Capacitance Characteristics in the Fully-Depleted SOI MOSFET", IEEE Transactions on Electron Devices, vol. 48, No. 2, Feb. 2001, pp. 388-391.
Ferlet-Cavrois, et al., "High Frequency Characterization of SOI Dynamic Threshold Voltage MOS (DTMOS) Transistors", 1999 IEEE International SOI Conference, Oct. 1999, pp. 24-25.
Yeh, et al., "High Performance 0.1um Partially Depleted SOI CMOSFET", 2000 IEEE International SOI Conference, Oct. 2000, pp. 68-69.
Bawedin, et al., "Unusual Floating Body Effect in Fully Depleted MOSFETs", IMEP, Enserg, France and Microelectronics Laboratory, UCL, Belgium, Oct. 2004, 22 pgs.
Flandre, et al., "Design of EEPROM Memory Cells in Fully Depleted 'CMOS SOI Technology'", Catholic University of Louvain Faculty of Applied Science, Laboratory of Electronics and Microelectronics, Academic Year 2003-2004, 94 pgs.
Takamiya, et al., "High-Performance Accumulated Back-Interface Dynamic Threshold SOI MOSFET (AB-DTMOS) with Large Body Effect at Low Supply Voltage", Japanese Journal of Applied Physics, vol. 38 (1999), Part 1, No. 4B, Apr. 1999, pp. 2483-2486.
Drake, et al., "Evaluation of Dynamic-Threshold Logic for Low-Power VLSI Design in 0.13um PD-SOI", IFIP VLSI-SoC 2003, IFIP WG 10.5 International Conference on Very Large Scale Integration of System-on-Chip, Darmstadt, Germany, Dec. 1-3, 2003.
Huang, et al., "Hot Carrier Degradation Behavior in SOI Dynamic-Threshold-Voltage nMOSFET's (n-DTMOSFET) Measured by Gated-Diode Configuration", Microelectronics Reliability 43 (2003), pp. 707-711.
Goo, et al., "History-Effect-Conscious SPICE Model Extraction for PD-SOI Technology", 2004 IEEE International SOI Conference, Oct. 2004, pp. 156-158.
Workman, et al., "Dynamic Effects in BTG/SOI MOSFETs and Circuits Due to Distributed Body Resistance", Proceedings 1997 IEEE International SOI Conference, Oct. 1997, pp. 28-29.
Ernst, et al., "Detailed Analysis of Short-Channel SOI DT-MOSFET", Laboratoire de Physique des Composants a Semiconducteurs, Enserg, France, Sep. 1999, pp. 380-383.
Huang, et al., "Device Physics, Performance Simulations and Measured Results of SOI MOS and DTMOS Transistors and Integrated Circuits", Beijing Microelectronics Technology Institute, 1998 IEEE, pp. 712-715.
Bernstein, et al., "Design and CAD Challenges in sub-90nm CMOS Technologies", IBM Thomas J. Watson Research Center, NY, Nov. 11-13, 2003, pp. 129-136.
Wiatr, et al., "Impact of Floating Silicon Film on Small-Signal Parameters of Fully Depleted SOI-MOSFETs Biased into Accumulation", Solid-State Electronics 49 (2005), revised on Nov. 9, 2004, pp. 779-789.
Gritsch, et al., "Influence of Generation/Recombination Effects in Simulations of Partially Depleted SOI MOSFETs", Solid-State Electronics 45 (2001), accepted Feb. 14, 2001, pp. 621-627.
Chang, et al., "Investigations of Bulk Dynamic Threshold-Voltage MOSFET with 65 GHz "Normal-Mode" Ft and 220GHz "Over-Drive Mode" Ft for RF Applications", Institute of Electronics, National Chiao-Tung Universtiy, Taiwan, 2001 Symposium on VLSI Technology Digest of Technical Papers, pp. 89-90.
Le TMOS en technologie SOI, 3.7.2.2 Pompage de charges, pp. 110-111.

(56) References Cited

OTHER PUBLICATIONS

Horiuchi, Masatada, "A Dynamic-Threshold SOI Device with a J-FET Embedded Source Structure and a Merged Body-Bias-Control Transistor—Part I: A J-FET Embedded Source Structure Properties", IEEE Transactions on Electron Devices, vol. 47, No. 8, Aug. 2000, pp. 1587-1592.
Horiuchi, Masatada, "A Dynamic-Threshold SOI Device with a J-FET Embedded Source Structure and a Merged Body-Bias-Control Transistor—Part II: Circuit Simulation", IEEE Transactions on Electron Devices, vol. 47, No. 8, Aug. 2000, pp. 1593-1598.
Casu, Mario Roberto, "High Performance Digital CMOS Circuits in PD-SOI Technology: Modeling and Design", Tesi di Dottorato di Recerca, Gennaio 2002, Politecnico di Torino, Corso di Dottorato di Ricerca in Ingegneria Elettronica e delle Communicazioni, 200 pgs.
Tinella, Carlo, "Study of the potential of CMOS-SOI technologies partially abandoned for radiofrequency applications", Thesis for obtaining the standard of Doctor of INPG, National Polytechnic of Grenoble, Sep. 25, 2003, 187 pgs.
Yamamoto, et al., "A Single-Chip GaAs RF Transceiver for 1.9GHz Digital Mobile Communication Systems", IEEE Journal of Solid-State Circuits, 1996.
Kelly, "Integrated Ultra CMIS Designs in GSM Front End", Wireless Design Magazine, 2004, pp. 18-22.
Tsutsumi, et al., "A Single Chip PHS Front End MMIC with a True Single +3 Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz, IEEE Transactions on Electron Devices, 1997, pp. 1981-1989.
Szedon, et al., "Advanced Silicon Technology for Microwave Circuits", Naval Research Laboratory, 1994, pp. 1-110.
Kai, An English translation of an Office Action received from the Japanese Patent Office dated Jul. 2010 relating to appln. No. 2007-518298.
Burgener, et al., Amendment filed in the USPTO dated Apr. 2010 relating to U.S. Appl. No. 11/501,125.
Heller, et al., "Cascode Voltage Switch Logic: A Different CMOS Logic Family", IEEE International Solid-State Circuits Conference, 1984, pp. 16-17.
Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
"CMOS SOI RF Switch Family", Honeywell, 2002, pp. 1-4.
"CMOS SOI Technology", Honeywell, 2001, pp. 1-7.
Analog Devices, "CMOS, Low Voltage RF/Video, SPST Switch", Analog Devices, inc., 1999, pp. 1-10.
Eggert, et al., "CMOS/SIMOX-RF-Frontend for 1.7GHz", Solid State Circuits Conference, 1996.
Aquilani, Communications pursuant to Article 94(3) EPC received from the EPO dated Mar. 2010 relating to appln. No. 05763216.8.
Weman, Communication under Rule 71(3) EPC and Annex Form 2004 received from the EPO dated Nov. 2009 relating to appln No. 020800982.7.
Van Der Peet, Communications pursuant to Article 94(3) EPC dated Aug. 2009 relating to appln. No. 02800982.7-2220.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.
Baker, et al., "Designing Nanosecond High Voltage Pulse Generators Using Power MOSFET's", Electronic Letters, 1994, pp. 1634-1635.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Luu, Final Office Action received from the USPTO dated Apr. 2009 relating to U.S. Appl. No. 11/351,342.
Colinge, "Fully Depleted SOI CMOs for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Eisenberg, et al., "High Isolation 1-20GHz MMIC Switches with On-Chip Drivers", IEEE Microwave and Millimeter-Wave Monolithic Circuits Symposium, 1989, pp. 41-45.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power DPDT Antenna Switch MMIC for Digital Cellular Systems", GaAs IC Symposium, 1995, pp. 75-78.
Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Hanzo, "Adaptive Wireless Transceivers", Wiley, 2002.
Lossee, "RF Systems, Components, and Circuits Handbook", Artech House, 1997.
Miller, "Moderin Electronic Communications", Prentice-Hall, 1999.
Minoli, "Telecommunications Technology Handbook", Artech House, 2003.
Morreale, "The CRC Handbook of Modern Telecommunications", CRC Press, 2001.
Sayre, "Complete Wireless Design", McGraw-Hill, 2001.

(56) References Cited

OTHER PUBLICATIONS

Shafi, "Wireless Communications in the 21st Century", Wiley, 2002.
Wei, et al., "Large-Signal Model of Triple-Gate MESFET/PHEMT for Switch Applications", Alpha Industries, Inc., 1999 IEEE, pp. 745-748.
Soyuer, et al., "RF and Microwave Building Blocks in a Standard BiCMOS Technology", IBM T.J. Watson Research Center, 1996 IEEE, pp. 89-92.
Mizutani, et al., "Compact DC-60-GHz HJFET MMIC Switches using Ohmic Electrode-Sharing Technology", IEEE Transactions on Microwave Theory and Techniques, vol. 46, No. 11, Nov. 1998, pp. 1597-1603.
Ota, et al., "High Isolation and Low Insertion Loss Switch IC Using GaAs MESFETs", IEEE Transactions on Microwave Theory and Techniques, vol. 43, No. 9, Sep. 1995, pp. 2175-2177.
Koo, Raymond, "RF Switches", Univ. Toronto, Elec. And Computer Engineering Dept. 2001, 12 pgs.
Titus, et al., "A Silicon BICMOS Transceiver Front-End MMIC Covering 900 and 1900 MHZ Applications", Hittite Microwave Corporation, IEEE 1996 Microwave and Millimeter-Wave Monolithic Circuits Symposium, pp. 73-75.
Rossek, Sacha, "Direct Optical Control of a Microwave Phase Shifter Using GaAs Field-Effect Transistors", Communications Research Group, School of Electronic Engineering, Faculty of Technology, Middlesex University, Sep. 1998, 224 pgs.
Schindler, et al., "DC-20 Ghz N X M Passive Switches", Raytheon Co., 1998 IEEE MTT-S Digest, pp. 1001-1005.
Houng, et al., "60-70 dB Isolation 2-19 GHz Switches", Raytheon Electromagnetic Systems Division, 1989 IEEE, GaAs IC Symposium, pp. 173-176.
Schindler, et al., "DC-40 GHz and 20-40 GHz MMIC SPDT Switches", IEEE Transactions of Electron Devices, vol. ED-34, No. 12, Dec. 1987, pp. 2595-2602.
Schindler, et al., "A 2-18 GHz Non-Blocking Active 2 X 2 Switch", Raytheon Company, 1989 IEEE, GaAs IC Symposium, pp. 181-183.
Schindler, et al., "A Single Chip 2-20 GHz T/R Module" 1988 IEEE, IEEE 1990 Microwave and Millimeter-Wave Monolithic Circuits Symposium, pp. 99-102.
McGrath, et al., "Novel High Performance SPDT Power Switches using Multi-Gate FETs", 1991 IEEE, 1991 IEEE MTT-S Digest, pp. 839-842.
Schindler, et al., "DC-20 GHz N X M Passive Switches", IEEE Transactions on Microwave Theory and Techniques, vol. 36, No. 12, Dec. 1988, pp. 1604-1613.
Bernkopf, et al., "A High Power K/Ka-Band Monolithic T/R Switch", 1991 IEEE, IEEE 1991 Microwave and Millimeter-Wave Monolithic Circuits Symposium, pp. 15-18.
Hoffman, Niels, Extended Search Report received from the EPO dated May 8, 2012 for related appln. No. 11153313.9, 4 pgs.
Peregrine Semiconductor Corporation, Translation of Response filed in the Chinese Patent Office on Feb. 29, 2012 for related appln. No. 200680025128.7, 1 pg.
Peregrine Semiconductor Corporation, Translation of Response filed in the Chinese Patent Office on Mar. 20, 2012 for related appln. No. 200680025128.7, 12 pgs.
Shingleton, Michael B., Notice of Allowance received from the USPTO dated Jun. 4, 2012 for related U.S. Appl. No. 11/881,816, 13 pgs.
Stuber, et al., Response filed in the USPTO dated Feb. 21, 2012 for related U.S. Appl. No. 13/028,144, 3 pgs.
Tat, Binh C., Office Action received from the USPTO dated Apr. 12, 2012 for related U.S. Appl. No. 13/028,144, 19 pgs.
Unterberger, Michael, extended European Search Report received from the EPO dated Sep. 30, 2011 for related appln. No. 10011669.8-2220, 9 pgs.
Weman, Eva, Communication of a Notice of Opposition received from the EPO dated Nov. 8, 2011 for related appln. No. 028000982.7, 33 pgs.

Kelly, Dylan, Amendment filed in the USPTO dated Dec. 20, 2012 for related U.S. Appl. No. 11/347,671, 10 pgs.
Kelly, Dylan, Comments on Examiner's Statement of Reasons for Allowance filed in the USPTO dated Nov. 16, 2011 for related U.S. Appl. No. 11/347,671, 4 pgs.
Peregrine Semiconductor Corporation, Response filed in EPO dated May 15, 2012 for related appln. No. 10011669.8, 19 pgs.
Nishide, Ryuji, Office Action received from the Japanese Patent Office dated Jul. 17, 2012 for related appln. No. 2008-521544, 4 pgs.
Stuber, et al., Response filed in the USPTO dated Aug. 3, 2012 for related U.S. Appl. No. 13/028,144, 6 pgs.
Peregrine Semiconductor Corporation, Demand filed in the EPO dated Aug. 17, 2012 for related appln. No. PCT/US2011/056942, 41 pgs.
Nguyen, Niki Hoang, Office Action received from the USPTO dated Sep. 26, 2012 for related U.S. Appl. No. 13/277,108, 47 pgs.
Cherne, et al., U.S. Statutory Invention Registration No. H1435, published May 2, 1995.
Matloubian, "Smart Body Contact for SOI MOSFETs", 1989 IEEE SOS/SOI Technology Conference, Oct. 1999, pp. 128-129.
Chuang, et al., "SOI for Digital CMOS VLSI Design: Design Consideration and Advances", Proceedings of the IEEE, vol. 86, No. 4, Apr. 1998, pp. 689-720.
Kuge, et al., "SOI-DRAM Circuit Technologies for Low Power High Speed Multigiga Scale Memories", IEEE Journal of Solid-State Circuits, vol. 31, No. 4, Apr. 1996, pp. 586-591.
Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-L858.
Casu, et al., "Synthesis of Low-Leakage PD-SOI Circuits with Body Biasing", Int'l Symposium on Low Power Electronics and Design, Aug. 2001, pp. 287-290.
Wang, et al., "Threshold Voltage Instability at Low Temperatures in Partially Depleted Thin Film SOI MOSFET's", 1990 IEEE SOS/SOI Technology Conference, Oct. 1990, pp. 91-92.
Shimomura, et al., "TP 4.3: A 1V 46ns 16Mb SOI-DRAM with Body Control Technique", 1997 IEEE Int'l Solid-State Circuits Conference, Feb. 1997.
Assaderaghi, et al, "Transient Pass-Transistor Leakage Current in SOI MOSFET's", IEEE Electron Device Letters, vol. 18, No. 6, Jun. 1997, pp. 241-243.
Mashiko, et al., "Ultra-Low Power Operation of Partially-Depleted SOI/CMOS Integrated Circuits", IEICE Transactions on Electronic Voltage, No. 11, Nov. 2000, pp. 1697-1704.
Das, et al., "Ultra-Low-Leakage Power Strategies for Sub-1 V VLSI: Novel Circuit Styles and Design Methodologies for Partially Depleted Silicon-on-Insulator (PD-SOI) CMOS Technology", Proceedings of the 16th Int'l Conference on VLSI Design, 2003.
Pelloie, et al., "WP 25.2: SOI Technology Performance and Modeling", 1999 IEEE Int'l Solid-State Circuits Conference, Feb. 1999.
Goldman, et al., "0.15um SOI DRAM Technology Incorporating Sub-Volt Dynamic Threshold Devices for Embedded Mixed-Signal & RF Circuits", 2001 IEEE SOI Conference, Oct. 2001, pp. 97-98.
Hirota, et a., "0.5V 320MHz 8b Multiplexer/Demultiplexer Chips Based on a Gate Array with Regular-Structured DTMOS/SOI", ISSCC, Feb. 1998, pp. 12.2-1-12.2-11.
Fuse, et al., "0.5V SOI CMOS Pass-Gate Logic", 1996 IEEE Int'l Solid-State Circuits Conference, Feb. 1996, pp. 88-89, 424.
Nguyen, Tram Hoang, Office Action received from the USPTO dated Apr. 11, 2012 for U.S. Appl. No. 13/412,529, 6 pgs.
Brindle, et al., Amendment filed in the USPTO dated Oct. 11, 2012 for U.S. Appl. No. 13/412,529, 15 pgs.
Brindle, et al., Amendment and Terminal Disclaimers filed in the USPTO dated Dec. 19, 2012 for U.S. Appl. No. 13/412,529, 17 pgs.
Nguyen, Niki Hoang, Notice of Allowance received from the USPTO dated Jan. 17, 2013 for U.S. Appl. No. 13/412,529, 13 pgs.
Nguyen, Niki Hoang, Notice of Allowance received from the USPTO dated Feb. 8, 2013 for U.S. Appl. No. 13/412,529, 19 pgs.
Brindle, et al., Comments on Examiner's Statement of Reasons for Allowance filed in the USPTO dated Feb. 8, 2013 for U.S. Appl. No. 13/412,529, 4 pgs.

(56) References Cited

OTHER PUBLICATIONS

Peregrine Semiconductor Corporation, Response filed in the EPO dated May 16, 2011 for related appln No. 11153281.8, 7 pgs.
Hiramoto, Toshiro, et al., "Low Power and Low Voltage MOSFETs with Variable Threshold Voltage Controlled by Back-Bias", IEICE Trans Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Fuse, et al., "A 0.5V 200MHz 1-Stage 32b ALU Using a Body Bias Controlled SOI Pass-Gate Logic", IEEE Int'l Solid-State Circuits Conference, Feb. 1997.
Ueda, et al., "A CAD Compatible SOI/CMOS Gate Array Having Body Fixed Partially Depleted Transistors", IEEE Int'l Solid-State Circuits Conference, Feb. 8, 1997, pp. 288-289.
Lee, et al., "Analysis of Body Bias Effect with PD-SOI or Analog and RF Applications", Solid State Electron, vol. 46, 2002, pp. 1169-1176.
Aquilani, Communication and supplementary European Search Report dated Nov. 2009 relating to appln. 05763216.
Unterberger, M., Summons to attend oral proceedings pursuant to Rule 115(1) EPC received from EPO dated Oct. 17, 2013 for related appln. No. 02800982.7, 15 pgs.
Kelly, Proposed Amendment After Final from the USPTO dated Jun. 2009 relating to U.S. Appl. No. 11/351,342.
Hirano, et al., "Impact of Actively Body-Bias Controlled (ABC) SOI SRAM by Using Direct Body Contact Technology for Low-Voltage Applications", IEEE, 2003, pp. 2.4.1-2.4 4.
Brindle, et al., Response and Terminal Disclaimer filed in the USPTO dated Dec. 26, 2012 for related U.S. Appl. No. 13/277,108, 17 pgs.
Corneglio, Bernard, International Preliminary Report on Patentability received from the EPO dated Feb. 6, 2013 for related appln. No. PCT/US2011/056942, 27 pgs.
Nguyen, Niki Hoang, Office Action received from the USPTO dated Apr. 10, 2013 for related U.S. Appl. No. 13/277,108, 184 pgs.
Stuber, et al., Response/Amendment filed in the USPTO dated Jul. 15, 2013 for related U.S. Appl. No. 13/028,144, 20 pgs.
Brindle, et al., Amendment filed in the USPTO dated Jul. 18, 2013 for related U.S. Appl. No. 13/277,108, 33 pgs.
Stuber, et al., "Comments on Examiner's Statement of Reasons for Allowance" filed in the USPTO dated Sep. 27, 2013 for related U.S. Appl. No. 13/028,144, 4 pgs.
Nguyen, Niki Hoang, Final Office Action received from the USPTO dated Sep. 27, 2013 for related U.S. Appl. No. 13/277,108, 9 pgs.
Tieu, Binh Kien, Notice of Allowance received from the USPTO dated Sep. 30, 2013 for related U.S. Appl. No. 12/980,161, 8 pgs.
Shingleton, Michael, Final Office Action received from the USPTO dated Oct. 23, 2013 for related U.S. Appl. No. 11/881,816, 25 pgs.
Burgener, et al., First Preliminary Amendment filed in the USPTO dated Apr. 27, 2012 for related U.S. Appl. No. 12/980,161, 21 pgs.
Tieu, Binh Kien, Office Action received from the USPTO dated Feb. 19, 2013 for related U.S. Appl. No. 12/980,161, 97 pgs.
Morena, Enrico, Communication pursuant to Article 94(3) EPC received from the EPO dated Dec. 18, 2013 for related appln. No. 06814836.0, 5 pgs.
Stuber, et al., Amendment filed in the USPTO dated Dec. 20, 2013 for related U.S. Appl. No. 13/028,144, 25 pgs.
Brindle, et al., Amendment After Final filed in the USPTO dated Dec. 27, 2013 for related U.S. Appl. No. 13/277,108, 8 pgs.
Peregrine Semiconductor Corporation, Response filed in the EPO dated Jan. 9, 2014 for related appln. No. 02800982.7, 21 pgs.

Nguyen, Niki Hoang, Notice of Allowance received from the USPTO dated Jan. 10, 2014 for related U.S. Appl. No. 13/277,108, 24 pgs.
European Patent Office, Brief Communication dated Jan. 16, 2014 regarding Oral Proceedings to be held Feb. 12, 2014, letter from opponent dated Jan. 10, 2014, for related appln. No. 02800982.7, 7 pgs.
Scheinberg, et al., "A Computer Simulation Model for Simulating Distortion in FET Resistors", IEEE Transactions on Computer-Aided Design of Integrated Circuits and Systems, vol. 19, No. 9, Sep. 2000, pp. 981-989.
Streetman, et al., "Solid State Electronic Devices", Microelectronics Research Center, Dept. of Electrical and Computer Engineering, The University of Texas at Austin, Chapter 6, 2004 by Pearson Education Inc., 4 pgs.
Tokumitsu, et al, "A Low-Voltage, High-Power T/R-Switch MMIC Using LC Resonators", IEEE Transactions on Microwave Theory and Techniques, vol. 43, No. 5, May 1995, pp. 997-1003.
Adan, et al., "OFF-State Leakage Current Mechanisms in BulkSi and SOI MOSFETs and Their Impact on CMOS ULSIs Standby Current", IEEE Transactions on Electron Devices, vol. 48, No. 9, Sep. 2001, pp. 2050-2057.
Chan, et al., "A Novel SOI CBiCMOS Compatible Device Structure for Analog and Mixed-Mode Circuits", Dept. of EECS, University of California at Berkeley, IEEE 1995, pp. 40-43.
Street, A.M., "RF Switch Design", The Institution of Electrical Engineers, 2000, pp. 4/1-4/7.
Adan, et al., "Linearity and Low-Noise Performance of SOI MOSFETs for RF Applications", IEEE Transactions on Electron Devices, vol. 49, No. 5, May 2002, pp. 881-888.
Cristoloveanu, et al., "The Four-Gate Transistor", Institute of Microelectronics, Electromagnetism and Photonics, ESSDERC 2001, pp. 323-326.
Ayasli, et al., "An X-Band 10 W Monolithic Transmit-Receive GaAs FET Switch", Raytheon Research Division, 1982 IEEE, pp. 42-46.
Analog Devices, "LC2MOS High Speed, Quad SPST Switch", Rev. B, 8 pgs.
Dufrene, et al., "The G4-FET: Low Voltage to High Voltage Operation and Performance", Dept. of Electrical and Computer Engineering, The University of Tennessee, IEEE 2003, pp. 55-56.
Pucel, et al., "A Multi-Chip GaAs Monolithic Transmit/Receive Module for X-Band", Research Division, Raytheon Company, 1982 IEEE MTT-S Digest, pp. 489-492.
Analog Devices, "LC2MOS Quad SPST Switches", Rev. B, 6 pgs.
Dufrene, et al., "Investigation of the Four-Gate Action in G4-FETs", IEEE Transactions on Electron Devices, vol. 51, No. 11, Nov. 2004, pp. 1931-1935.
Ayasli, et al., "A Monolithic Single-Chip X-Band Four-Bit Phase Shifter", IEEE Transactions on Microwave Theory and Techniques, vol. MTT-30, No. 12, Dec. 1982, pp. 2201-2222.
Akarvardar, et al., "Multi-Bias Dependence of Threshold Voltage, Subthreshold Swing, and Mobility in G4-FETs", Institute of Microelectronics, Electromagnetism, and Photonics, IEEE 2003, pp. 127-130.
Lim, et al., "Partial SOI LDMOSFETs for High-Side Switching", Dept. of Engineering, University of Cambridge, 1999 IEEE, pp. 149-152.
Akarvardar, et al., "Threshold Voltage Model of the SOI 4-Gate Transistor", 2004 IEEE International SOI Conference, Oct. 2004, pp. 89-90.
Ming, et al., "A New Structure of Silicon-on-Insulator Metal-Oxide-Semiconductor Field Effect Transistor to Suppress the Floating Body Effect", Chin. Phys. Lett., vol. 20, No. 5 (2003), pp. 767-769.
Allen, Thomas P., "Characterization and Modeling of Silicon-on-Insulator Field Effect Transistors", Department of Electrical Engineering and Computer Science, MIT, May 20, 1999, 80 pgs.
Fung, et al., "Frequency Dispersion in Partially Depleted SOI MOSFET Output Resistance", Proceedings 1996 IEEE International SOI Conference, Oct. 1996, pp. 146-147.
Chen, Suheng, "G4-FET Based Voltage Reference", Masters Theses, University of Tennessee, Knoxville, Trace: Tennessee Research and Creative Exchange, May 2004, 57 pgs.

(56) References Cited

OTHER PUBLICATIONS

Zhu, et al., "Simulation of Suppression of Floating-Body Effect in Partially Depleted SOI MOSFET Using a Sil-xGex Dual Source Structure", Materials Science and Engineering B 114-115 (2004), pp. 264-268.
Hieda, et al., Floating-Body Effect Free Concave SOI-MOSFETs (COSMOS), ULSI Research Center, Toshiba Corporation, IEEE 1991, pp. 26.2.1-26.2.4.
Marks, Jeffery Earl, "SOI for Frequency Synthesis in RF Integrated Circuits", Thesis submitted to North Carolina State University, 2003, 155 pgs.
Moye, et al., "A Compact Broadband, Six-Bit MMIC Phasor with Integrated Digital Drivers+", IEEE 1990 Microwave and Millimeter-Wave Monolithic Circuits Symposium, 1988 IEEE, pp. 123-126.
Smuk, et al., "Monolithic GaAs Multi-Throw Switches with Integrated Low-Power Decoder-Driver Logic", Hittite Microwave Corporation, Jun. 1997, 4 pgs.
Dribinsky, et al., Notice of Appeal and Pre-Appeal Brief Request for Review filed in the USPTO dated Feb. 20, 2014 for related U.S. Appl. No. 11/881,816, 7 pgs.
Huber & Schussler, Report on Decision in EPO Opposition Division for related appln. No. 02800982.7-2220 dated Feb. 25, 2014, 13 pgs.
Dang, Hung J., Office Action received from the USPTO dated Feb. 26, 2014 for related U.S. Appl. No. 12/735,954, 34 pgs.
Dribinsky, et al., Response filed in the USPTO dated Feb. 4, 2014 for related U.S. Appl. No. 11/881,816, 20 pgs.
Shingleton, Michael, Advisory Action received from the USPTO dated Feb. 19, 2014 or related U.S. Appl. No. 11/881,816, 3 pgs.
Tat, Binh C., Office Action received from the USPTO dated May 23, 2014 for related U.S. Appl. No. 13/948,094, 7 pgs.
Unterberger, Michael, Communication pursuant to Article 101(1) and Rule 81(2) to (3) received from the EPO dated Mar. 3, 2014 for related appln. No. 02800982.7, 3 pgs.
Weman, Eva, Provision of a copy of the minutes in accordance with Rule 124(4) EPC received from the EPO dated Apr. 10, 2014 for related appln. No. 02800982.7, 9 pgs.
European Patent Office, Brief Communication received from the EPO dated May 8, 2014 for related appln. No. 02800982.7, 2 pgs.
Peregrine Semiconductor Corporation, Reply filed in the EPO dated May 8, 2014 for related appln. No. 02800982.7, 79 pgs.
Unterberger, Michael, Communication pursuant to Article 94(3) EPC received from the EPO dated Apr. 9, 2014 for related appln. No. 10011669.8, 5 pgs.
Tieu, Binh Kien, Office Action received from the USPTO dated Jun. 24, 2014 for related U.S. Appl. No. 14/062,791, 7 pgs.
Peregrine Semiconductor Corporation, English translation of Response filed in the JPO dated Jul. 3, 2014 for related appln. No. 2013-003388, 14 pgs.
Tat, Binh C., Notice of Allowance received from the USPTO dated Jul. 18, 2014 for related U.S. Appl. No. 13/028,144, 29 pgs.
Caverly, et al., "SPICE Modeling of Microwave and RF Control Diodes", IEEE, 2000, pp. 28-31.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Karandikar, et al., "Technology Mapping for SOI Domino Logic Incorporating Solutions for the Parasitic Bipolar Effect", ACM, 2001, pp. 1-14.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.
Caverly, et al., "CMOS RF Circuits for Integrated Wireless Systems", IEEE, 1998, pp. 1-4.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, "CMOS RF: (Still) No Longer an Oxymoron (Invited)", IEEE Radio Frequency Integrated Circuits Symposium, 1999, pp. 3-6.
Madihian, et al., "A 2-V, 1-10GHz BiCMOS Transceiver Chip for Multimode Wireless Communications Networks", IEEE, 1997, pp. 521-525.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Nishijima, et al., "A High Performance Transceiver Hybrid IC for PHS Hand Set Operating with Single Positive Voltage Supply", Microwave Symposium Digest, 1997, pp. 1155-1158.
O, et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.
Uda, et al., "A High Performance and Miniturized Dual Use (antenna/local) GaAs SPDT Switch IC Operating at +3V/0V", Microwave Symposium Digest, 1996, pp. 141-144.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Park, "A Regulated, Charge Pump CMOS DC/DC Converter for Low Power Application", 1998, pp. 1-62.
Hittite Microwave, Floating Ground SPNT MMIC Switch Driver Techniques, 2001.
Caverly, et al., "Gallium Nitride-Based Microwave and RF Control Devices", 2001.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.

(56) References Cited

OTHER PUBLICATIONS

"A Voltage Regulator for GaAs FETs", Microwave Journal, 1995.
Slobodnik, et al., "Millimeter Wave GaAs Switch FET Modeling", Microwave Journal, 1989.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Wells, Kenneth B., Office Action received from the USPTO dated Oct. 29, 2018 for U.S. Appl. No. 15/939,128, 210 pgs.
Wells, Kenneth B., Office Action received from the USPTO dated Dec. 12, 2018 for U.S. Appl. No. 15/939,128, 18 pgs.
Wells, Kenneth B., Notice of Allowance received from the USPTO dated Jul. 17, 2019 for U.S. Appl. No. 15/939,128, 19 pgs.
Wells, Kenneth B., Notice of Allowance received from the USPTO dated Oct. 17, 2019 for U.S. Appl. No. 15/939,128, 10 pgs.
Psemi Corporation, Preliminary Amendment filed in the USPTO dated Jun. 26, 2018 for U.S. Appl. No. 15/939,128, 5 pgs.
Psemi Corporation, Response filed in the USPTO dated Nov. 9, 2018 for U.S. Appl. No. 15/939,128, 13 pgs.
Psemi Corporation, Response filed in the USPTO dated Jan. 24, 2019 for U.S. Appl. No. 15/939,128, 10 pgs.
Willard, et al., "AC Coupling Modules for Bias Ladders", patent application filed Mar. 28, 2018 for U.S. Appl. No. 15/939,144, 60 pgs.
Willard, et al., "Stacked FET Switch Bias Ladders", patent application filed Mar. 28, 18 for U.S. Appl. No. 15/939,132, 62 pgs.
Mattison, David, Office Action received from the USPTO dated Sep. 28, 2017 for U.S. Appl. No. 15/289,768, 44 pgs.
Vergoosen, Joannes, International Search Report and Written Opinion received from the EPO dated Dec. 22, 2016 for appln. No. PCT/US2016/056684, 14 pgs.
Chen, Patrick C., Office Action received from the USPTO dated Apr. 4, 2017 for U.S. Appl. No. 15/256,453, 6 pgs.
Chen, Patrick C., Office Action received from the USPTO dated May 25, 2017 for U.S. Appl. No. 15/256,453, 11 pgs.
Ranta, Tero Tapio, Response filed in the USPTO dated Apr. 14, 2017 for U.S. Appl. No. 15/256,453, 3 pgs.
Ranta, Tero Tapio, Response filed in the USPTO dated Aug. 24, 2017 for U.S. Appl. No. 15/256,453, 11 pgs.
Rojas, Daniel E., Office Action received from the USPTO dated Feb. 21, 2013 for U.S. Appl. No. 12/803,139, 7 pgs.
Rojas, Daniel E., Office Action received from the USPTO dated Jun. 17, 2013 for U.S. Appl. No. 12/803,139, 36 pgs.
Rojas, Daniel E., Notice of Allowance received from the USPTO dated Oct. 22, 2013 for U.S. Appl. No. 12/803,139, 142 pgs.
Ranta, et al., Response filed in the USPTO dated Sep. 17, 2013 for U.S. Appl. No. 12/803,139, 14 pgs.
Ranta, et al., Response filed in the USPTO dated May 20, 2013 for U.S. Appl. No. 12/803,139, 8 pgs.
Utagawa, Tsutomu, English translation of Notification of Reasons for Refusal received from the JPO dated Jun. 4, 2013 for related appln. No. 2010-548750, 3 pgs.
Wells, Kenneth B., Office Action received from the USPTO dated Nov. 2, 2018 for U.S. Appl. No. 15/939,144, 11 pgs.
Itoh, et al., English Translation of Decision to Refuse received from the JPO dated Oct. 30, 2018, 20 pgs.
Wells, Kenneth B., Notice of Allowance received from the USPTO dated Jan. 14, 2019 for U.S. Appl. No. 15/939,144, 205 pgs.
Nguyen, Niki Hoang, Notice of Allowance received from the USPTO dated May 8, 2019 for U.S. Appl. No. 16/046,974, 25 pgs.
Gundlach, Susanne, Invitation to Pay Additional Fees and, Where Applicable, Protest Fee received from the EPO dated Jul. 5, 2019 for appln. No. PCT/US2019/024143, 13 pgs.
Wells, Kenneth B., Office Action received from the USPTO dated Sep. 4, 2019 for U.S. Appl. No. 16/261,167, 31 pgs.
Nguyen, Hai L., Notice of Allowance received from the USPTO dated Oct. 4, 2019 for U.S. Appl. No. 16/053,710, 27 pgs.
Ranta, et al., "Positive Logic Switch with Selectable DC Blocking Circuit", patent application filed Mar. 28, 2018 for U.S. Appl. No. 15/939,128, 62 pgs.
Nguyen, Niki Hoang, Notice of Allowance received from the USPTO dated May 29, 2019 for U.S. Appl. No. 16/377,026, 8 pgs.
Wells, Kenneth B., Final Office Action received from the USPTO dated Jan. 28, 2020 for U.S. Appl. No. 16/261,167, 25 pgs.
Fermentel, Thomas, International Search Report and Written Opinion received from the EPO dated Jan. 8, 2020 for appln. No. PCT/US2019/024143, 19 pgs.
Chen, Patrick C., Office Action received from the USPTO dated Jan. 28, 2020 for U.S. Appl. No. 16/653,728, 9 pgs.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Kuo, et al., "Low-Voltage SOI CMOS VLSI Devices and Circuits", Wiley Interscience, XP001090589, New York, 2001, 215 pgs.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
Pozar, "Microwave and RF Design of Wireless Systems", Wiley, 2001.
Maas, "The RF and Microwave Circuit Design Cookbook", Artech House, 1998.
Douseki, et al., "A 0.5-V MTCMOS/SIMOX Logic Gate", IEEE Journal of Solid-State Circuits, vol. 32, No. 10, Oct. 1997.
Douseki, et al., "A 0.5v SIMOX-MTMCOS Circuit with 200ps Logic Gate", IEEE Int'l Solid-State Circuits Conference, 1996, pp. 84-85, 423.
Shimomura, et al., "A 1-V 46-ns 16-mb SOI-DRAM with Body Control Technique", IEEE Journal of Solid-State Circuits, vol. 32, No. 11, Nov. 1997, pp. 1712-1720.
Keys, "Low Distortion Mixers or RF Communications", Ph.D. Thesis, University of California-Berkeley, 1995.
Kuang, et al., "A Dynamic Body Discharge Technique for SOI Circuit Applications", IEEE Int'l SOI Conference, Oct. 1999, pp. 77-78.
Assaderaghi, et al., "A Dynamic Threshold Voltage MOSFET (DTMOS) for Ultra-Low Voltage Operation", Int'l Electron Devices Meeting, Dec. 1994, pp. 809-812.
Gil, et al., "A High Speed and Low Power SOI Inverter Using Active Body-Bias", Proceedings Int'l Symposium on Low Power Electronics and Design, Aug. 1998, pp. 59-63.
Gil, et al., "A High Speed and Low Power SOI Inverter Using Active Body-Bias", Solid-State Electronics, vol. 43, 1999, pp. 791-799.
Kuang, et al., "A High-Performance Body-Charge-Modulated SOI Sense Amplifier", IEEE Int'l SOI Conference, Oct. 2000, pp. 100-101.
Chung, et al., "A New SOI Inverter for Low Power Applications", IEEE SOI Conference, Oct. 1996, pp. 20-21.
Chung, et al., "A New SOI Inverter Using Dynamic Threshold for Low-Power Applications", IEEE Electron Device Letters, vol. 18, No. 6, Jun. 1997, pp. 248-250.
Chung, et al., "A New SOI MOSFET Structure with Junction Type Body Contact", Int'l Electron Device Meeting (IEDM) Technical Digest, 1999, pp. 59-62.
Terauchi, et al., "A Novel 4T SRAM Cell Using "Self-Body-Biased" SOI MOSFET Structure Operating at 0.5 Volt", IEEE Int'l SOI Conference, Oct. 2000, pp. 108-109.
Wang, et all., "A Novel Low-Voltage Silicon-On-Insulator (SOI) CMOS Complementary Pass-Transistor Logic (CPL) Circuit Using Asymmetrical Dynamic Threshold Pass-Transistor (ADTPT) Technique", Proceedings of the 43rd IEEE Midwest Symposium on Circuits and Systems, Aug. 2000, pp. 694-697.
Das, et al., "A Novel Sub-1 V High Speed Circuit Design Technique in Partially Depleted SOI-CMOS Technology with Ultra Low

(56) References Cited

OTHER PUBLICATIONS

Leakage Power", Proceedings of the 28th European Solid-State Circuits Conference, Sep. 2002, pp. 24-26.
Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270.
Kanda, et al., "A Si RF Switch MMIC for the Cellular Frequency Band Using SOI-CMOS Technology", Institute of Electronics, Information and Communication Engineers Technical Report, vol. 100, No. 152, Jun. 2000, pp. 79-83.
Nakatani, "A Wide Dynamic Range Switched-LNA in SiGe BICMOS", IEEE Radio Frequency Integrated Circuits Symposium, 2001, pp. 223-226.
Tseng, et al., "AC Floating-Body Effects and the Resultant Analog Circuit Issues in Submicron Floating body and Body-Grounded SOI MOSFET's", IEEE Transactions on Electron Devices, vol. 46, No. 8, Aug. 1999, pp. All.
Tseng, et al., "AC Floating-Body Effects in Submicron Fully Depleted (FD) SOI nMOSFET's and the Impact on Analog Applications", IEEE Electron Devices, vol. 19, No. 9, Sep. 1998, pp. 351-353.
Wada, et al., "Active Body-Bias SOI-CMOS Driver Circuits", Symposium on VLSI Circuits Digest of Technical Papers, 1997, pp. 29-30.
Saccamango, et al., "An SOI Floating Body Charge Monitor Technique", IEEE Int'l SOI Conference, Oct. 2000, pp. 88-89.
Dunga, "Analysis of Floating Body Effects in Thin Film SOI MOSFET's Using the GIDL Current Technique", Proceedings of the 8th Int'l Symposium on Physical and Failure Analysis of Integrated Circuits, 2001, pp. 254-257.
Gautier, et al., "Body Charge Related Transient Effects in Floating Body SOI NMOSFETs", IEDM Tech. Digest, 1995, pp. 623-626.
Koh, et al., "Body-Contacted SOI MOSFET Structure and its Application to DRAM", IEEE Transactions on Electron Devices, vol. 45, No. 5, May 1998, pp. 1063-1070.
Koh, et al., "Body-Contacted SOI MOSFET Structure with Fully Bulk CMOS Compatible Layout and Process", IEEE Electron Device Letters, vol. 18, No. 3, Mar. 1997, pp. 102-104.
Tseng, et al., "Characterization of Floating Body and Body-Grounded Thin Film Silicon-on-Insulator MOSFETs for Analog Circuit Applications", Ph.D. Thesis, UCLA, 1999, pp. All.
Madihian, et al., "CMOS RF ICs for 900MHz-2.4GHz Band Wireless Communication Networks", IEEE Radio Frequency Integrated Circuits Symposium, 1999, pp. 13-16.
Eschenbach, Communication from the EPO dated Feb. 4, 2009 for related appln. No. 06786943.8, 101 pgs.
Sudhama, et al., "Compact Modeling and Circuit Impact of a Novel Frequency Dependence of Capacitance in RF MOSFETs", Nano Science and Technology Institute, Technical Proceedings of the 2001 Int'l Conference of Modeling and Simulation of Microsystems. 2001.
Casu, et al., "Comparative Analysis of PD-SOI Active Body-Biasing Circuits", IEEE Int'l SOI Conference, Oct. 2000, pp. 94-95.
Cho, et al., "Comparative Assessment of Adaptive Body-Bias SOI Pass-Transistor Logic", Fourth Int'l Symposium on Quality Electronic Design, Mar. 2003, pp. 55-60.
Chan, et al., "Comparative Study of Fully Depleted and Body-Grounded Non Fully Depleted SOI MOSFET's for High Performance Analog and Mixed Signal Circuits", IEEE Transactions on Electron Devices, vol. 42, No. 11, Nov. 1995, pp. 1975-1981.
Tseng, et al. "Comprehensive Study on AC Characteristics in SOI MOSFETs for Analog Applications", 1998 Symposium on VLSI Technology Digest of Technical Papers, Jun. 1998.
Pelella, et al., "Control of Off-State Current in Scaled PD/SOI CMOS Digital Circuits", Proceedings IEEE Int'l SOI Conference, Oct. 1998, pp. 147-148.
Assaderaghi, "DTMOS: Its Derivatives and Variations, and Their Potential Applications", The 12th Int'l Conference on Microelectronics, Nov. 2000, pp. 9-10.
Lindert, et al. "Dynamic Threshold Pass-Transistor Logic for Improved Delay at Lower Power Supply Voltages", IEEE Journal of Solid-State Circuits, vol. 34, No. 1, Jan. 1999, pp. 85-89.
Drake, et al., "Dynamic-Threshold Logic for Low Power VLSI Design", www.research.ibm.com/acas, 2001.
Wei, et al., "Effect of Floating-Body Charge on SOI MOSFET Design", IEEE Transaction on Electron Devices, vol. 45, No. 2, Feb. 1998.
Duyet, et al., "Effects of Body Reverse Pulse Bias on Geometric Component of Charge Pumping Current in FD SOI MOSFETs", Proceedings IEEE Int'l SOI Conference, Oct. 1998, pp. 79-80.
Krishnan, "Efficacy of Body Ties Under Dynamic Switching Conditions in Partially Depleted SOI CMOS Technology", Proceedings IEEE Int'l SOI Conference, Oct. 1997, pp. 140-141.
Lu, et al., "Floating Body Effects in Partially Depleted SOI CMOS Circuits", ISPLED, Aug. 1996, pp. 1-6.
Ueda, et al., "Floating Body Effects on Propagation Delay in SOI/CMOS LSIs", IEEE SOI Conference, Oct. 1996, pp. 142-143.
Matsumoto, et al., "Fully Depleted 30-V-Class Thin Film SOI Power MOSFET", IEDM 95-979, 1995, pp. 38.6.1-38.6.4.
Assaderaghi, et al., "History Dependence of Non-Fully Depleted (NFD) Digital SOI Circuits", 1996 Symposium on VLSI Technology Digest of Technical Papers 13.1, 1996, pp. 122-123.
Damiano, et al., "Integrated Dynamic Body Contact for H Gate PD SOI MOSFETs for High Performance/Low Power", IEEE SOI Conference, Oct. 2004, pp. 115-116.
Rauly, et al., Investigation of Single and Double Gate SOI MOSFETs in Accumulation Mode for Enhanced Performances and Reduced Technological Drawbacks, Proceedings 30th European Solid-State Device Research Conference, Sep. 2000, pp. 540-543.
Morishita, et al., "Leakage Mechanism Due to Floating Body and Countermeasure on Dynamic Retention Mode of SOI-DRAM", 1995 Symposium on VLSI Technology Digest of Technical Papers, Apr. 1995, pp. 141-142.
Smith, "Modern Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Barker, Communications Electronics—Systems, Circuits, and Devices, 1987, Prentice-Hall.
Carr, "Secrets of RF Circuit Design", McGraw-Hill, 1997.

\* cited by examiner

HIGH POWER POSITIVE LOGIC SWITCH

CROSS-REFERENCE TO RELATED APPLICATIONS

The present non-provisional patent application claims priority to the following provisional patent application, assigned to the assignee of the present invention, the contents of which are incorporated by reference: U.S. Patent Application Ser. No. 62/957,705, filed Jan. 6, 2020, entitled "High Power Positive Logic Switch".

The present application may be related to the following patents and patent applications, the contents of all of which are incorporated herein by reference:

U.S. patent application Ser. No. 15/939,128, filed Mar. 28, 2018, entitled "Positive Logic Switch with Selectable DC Blocking Circuit";

U.S. patent application Ser. No. 15/939,132, filed Mar. 28, 2018, entitled "Stacked FET Switch Bias Ladders";

U.S. patent application Ser. No. 15/939,144, filed Mar. 28, 2018, entitled "AC Coupling Modules for Bias Ladders", now U.S. Pat. No. 10,236,872, issued Mar. 19, 2019.

BACKGROUND

(1) Technical Field

The invention relates to electronic circuits, and more particularly to radio frequency electronic switch circuits and related methods.

(2) Background

In radio frequency (RF) systems, such as cellular phones and WiFi networks, electronic switch circuits are often used in series with RF signal lines to selectively block or conduct RF signals, such as between an antenna and a transceiver circuit. Electronic switch circuits are also often used in a shunt configuration between an RF signal line and a reference potential (e.g., circuit ground), for example, to selectively isolate nodes of the RF signal line from significantly influencing other circuitry.

As one example, FIG. 1 is a simplified schematic circuit 100 of a common prior art series-shunt RF switch circuit configuration. In the illustrated configuration, a first series switch 102, shown in a closed (conducting or ON) state, is coupled between a first antenna port ANT1 and a transmission TX port. A second series switch 104, shown in an open (blocking or OFF) state, is coupled between a second antenna port ANT2 and the TX port. A shunt switch 106 is coupled between the TX port and circuit ground.

Ideally, switches such as those shown in FIG. 1 should not appreciably alter or affect an RF signal. However, in integrated circuits, RF switching circuits are generally implemented with transistors, particularly field-effect transistors (FETs), and more particularly MOSFETs. A FET in a conducting (ON) state presents some resistance, $R_{ON}$, to a conducted signal, and in a blocking (OFF) state presents some capacitance, $C_{OFF}$, which may be in series, shunt, or parallel to an RF signal line. Accordingly, FET-based switch circuits generally behave less than ideally in an RF circuit.

A further issue with FET-based switch circuits is that the voltage that a single FET can withstand between drain and source without breaking down is generally limited to a few volts. In an electronic system, there may be parts of the system where the voltage that must be withstood far exceeds the voltage handling capability of a single FET. A common solution is to series stack FETs so that the drain-source voltage across any one FET is less than its drain-source breakdown voltage.

For example, FIG. 2 is a schematic circuit of a prior art RF switch circuit 200 using FET stacks. In the illustrated embodiment, an RF signal (e.g., from a transmitter to an antenna) may be coupled from terminal RF1 to terminal RF2 through a stack of series-coupled FETs M1-Mx. In this example, the FETs M1-Mx are configured as "positive-logic" devices, and may be, for example zero-Vt, low-Vt, or high-Vt FETs of a type that require a negative $V_{GS}$ to turn OFF but are configured so as to not require a negative voltage to turn OFF. Stated another way, positive-logic devices require a negative VGS to turn OFF but operate with positive control voltages (although the drain voltage may be biased to a positive voltage as well). In contrast, conventional FETs require a negative voltage supply to control switching, often from a negative voltage charge pump.

Each positive-logic FET M1-Mx includes a dedicated gate resistor Rg coupled between the corresponding FET gate and a non-negative gate bias voltage Vgate. In addition, the source and drain of each positive-logic FET M1-Mx is coupled to a non-negative drain-source (DS) bias voltage Vdrain through a corresponding drain-source resistor Rds (some of the resistors Rds are shared by adjacent FETs). Other bias networks may be used, such as taught in U.S. patent application Ser. No. 15/939,132 referenced above.

A switch circuit based on positive-logic FETs is useful for applications where generating a negative supply voltage is either not desired or not practical due to design constraints; in some applications, use of a negative charge pump is not even possible. These are generally applications with stringent requirements, such as extremely low current and power consumption, extremely low noise sensitivity, and/or very small IC die areas. Moreover, in biasing schemes wherein charge pumps are used to generate negative supply power, switching speed is limited by the current sourcing capability of the charge pumps. In addition, the bias voltage has to go through the series gate resistors of the FETs, which can slow the switching process.

In the circuit illustrated in FIG. 2, the positive-logic FETs M1-Mx are turned ON by applying a positive Vgate voltage (e.g., +3V) to the FET gates through respective gate resistors Rg, while applying a Vdrain voltage of 0V to the FET drains and sources through respective Rds resistors. This configuration effectively creates a positive DC gate-source voltage, $V_{GS}$, for every FET M1-Mx (i.e., $V_{GS}$=+3V with respect to the source voltage of 0V if Vgate=+3V). The FET stacks are turned OFF by applying a Vgate voltage of 0V to the FET gates through respective gate resistors Rg, while applying a positive Vdrain voltage (e.g., +3V) to the FET drains and sources through respective Rds resistors. This effectively creates, in relative terms, a negative $V_{GS}$ for every FET M1-Mx (i.e., $V_{GS}$=−3V with respect to the source voltage of +3V if Vgate=0V).

Obtaining a negative $V_{GS}$ for the OFF state is accomplished by including at least one "end-cap" FET $M_0$ on the end of, and series-coupled to, the positive-logic FETs M1-Mx. An end-cap FET $M_0$ is a FET having a high-Vt that turns OFF when the $V_{GS}$ of the FET is essentially zero volts. The end-cap $M_0$ FETs selectably provide either a capacitive DC blocking function or a resistive signal path. With the capacitive DC blocking function of the end-cap $M_0$ FETs, when a positive Vdrain voltage is applied, a positive voltage can be built up on the drain and source nodes of the positive-logic FETs M1-Mx. Without the capacitive DC blocking function of the end-cap $M_0$ FETs, the source or drain of the FET closest to an RF signal input (e.g., FET Mx adjacent to input RF1 and/or FET M1 adjacent to RF2) would be DC biased by low impedance circuitry connected to the RF signal input terminals and not by Vdrain.

Some embodiments of the RF switch circuit 200 may comprise a stack of only $M_0$ FETs, or a mix of positive-logic FETs and $M_0$ FETs, so long as at least one end-cap FET is an $M_0$ FET. In general, embodiments of the RF switch circuit 200 are bidirectional, and accordingly RF1 and RF2 are interchangeable terminals, and the designation of "drain" and "source" for each FET depends on connections of RF1 and RF2 to external components (including circuit ground). Further details of the circuit configuration shown in FIG. 2 may be found, for example, in U.S. patent application Ser. No. 15/939,128, referenced above.

While the RF switch circuit 200 of FIG. 2 works well for many applications, an area for improvement is in handling high voltage. During the OFF state, high enough RF power levels applied to the terminal $M_0$ FETs 202, 204 will cause the AC gate voltage to rise high enough for those FETs to turn ON due to capacitive voltage division of the RF signal. This "forced ON" possibility for the terminal $M_0$ FETs 202, 204 limits the power handling of the RF switch circuit 200. One solution, described in U.S. Pat. No. 10,236,872 referenced above, is to couple a respective terminal capacitor $C_S$, $C_D$ between an RF terminal RF1, RF2 and the gate of the respective terminal $M_0$ FET 202, 204 nearest the RF terminal RF1, RF2, as shown in FIG. 2. In an alternative configuration, the terminal capacitors $C_S$, $C_D$ may be coupled across the source and drain of respective terminal $M_0$ FETs 202, 204 (shown in FIG. 2 with dotted connecting lines for the terminal capacitors $C_S$, $C_D$). Due to the terminal capacitors $C_S$, $C_D$, the AC component of RF power applied to RF1 or RF2 is capacitively coupled to the respective gates of the terminal $M_0$ FETs 202, 204, while any DC component of RF power is blocked. The $C_S$, $C_D$ capacitors, in parallel or series with the parasitic capacitors of the devices themselves, balance the AC voltage division across an OFF stack of FETs. Accordingly, the $V_{GS}$ of the terminal $M_0$ FETs 202, 204 remains below the threshold of turning ON, preventing the terminal $M_0$ FETs 202, 204 from turning ON at high RF power levels. A large RF signal voltage only appears between nodes A, A', across the "gate-drain/gate-source" junctions of the positive-logic FETs M1-Mx. The values of the terminal capacitors $C_S$, $C_D$ may be determined by the sizing of the FETs M1-Mx and $M_0$ used in the stack.

A drawback of using terminal capacitors $C_S$, $C_D$ to increase the power handling capability of the RF switch circuit 200 is that the capacitor values need to be relatively large to be effective at protecting the circuit at high power levels. Large capacitors not only consume large areas on integrated circuit (IC) dies, but also increase the insertion loss (IL) of the RF switch circuit 200 in an ON state.

Accordingly, there is a need for an improved FET-based RF switch stack that does not require a negative bias voltage, and which can withstand application of a high voltage RF signal without consuming large IC areas. The present invention addresses these and other needs.

SUMMARY

The invention encompasses an improved FET-based RF switch stack that does not require a negative bias voltage, and which can withstand application of a high voltage RF signal without requiring terminal capacitors.

Some embodiments include a stack of FET switches, with at least one FET switch requiring a negative $V_{GS}$ to turn OFF and configured so as to not require a negative voltage, series-coupled on at least one end to an end-cap FET that turns OFF when the $V_{GS}$ of such end-cap FET is essentially zero volts, wherein at least one end-cap FET is configured to be coupled to a corresponding RF signal source and has a gate coupled to the corresponding RF signal source through an associated switch circuit.

Some embodiments include a stack of FET switches, including at least one positive-logic FET requiring a negative $V_{GS}$ to turn OFF and configured so as to not require a negative voltage, series-coupled on at least one end to an end-cap FET that turns OFF when the $V_{GS}$ of such end-cap FET is essentially zero volts, wherein at least one end-cap FET is configured to be coupled to a corresponding RF signal source and has a gate coupled to the corresponding RF signal source through an associated switch circuit.

Some embodiments include a FET switch stack, including: one or more positive-logic FETs requiring a negative $V_{GS}$ to turn OFF and configured so as to not require a negative voltage; a first end-cap FET that turns OFF when the $V_{GS}$ of the first end-cap FET is essentially zero volts, series-coupled to a first end of the one or more series-coupled positive-logic FETs wherein at least one end-cap FET has a gate and is configured to be coupled to a corresponding RF signal source; and at least one switch circuit, each switch circuit coupled between the gate of an associated end-cap FET and the corresponding RF signal source.

In the various embodiments, the switch circuit may include an NMOSFET series-coupled to a PMOSFET, and/or a diode coupled to the corresponding RF signal source and an NMOSFET coupled between the diode and the gate of the associated end-cap FET, and/or a diode coupled to the corresponding RF signal source and an NMOSFET series-coupled to a PMOSFET between the diode and the gate of the associated end-cap FET.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements unless the context suggest otherwise.

DETAILED DESCRIPTION

The invention encompasses an improved FET-based RF switch stack that does not require a negative bias voltage, and which can withstand application of a high voltage RF signal without requiring terminal capacitors.

Figure 3:
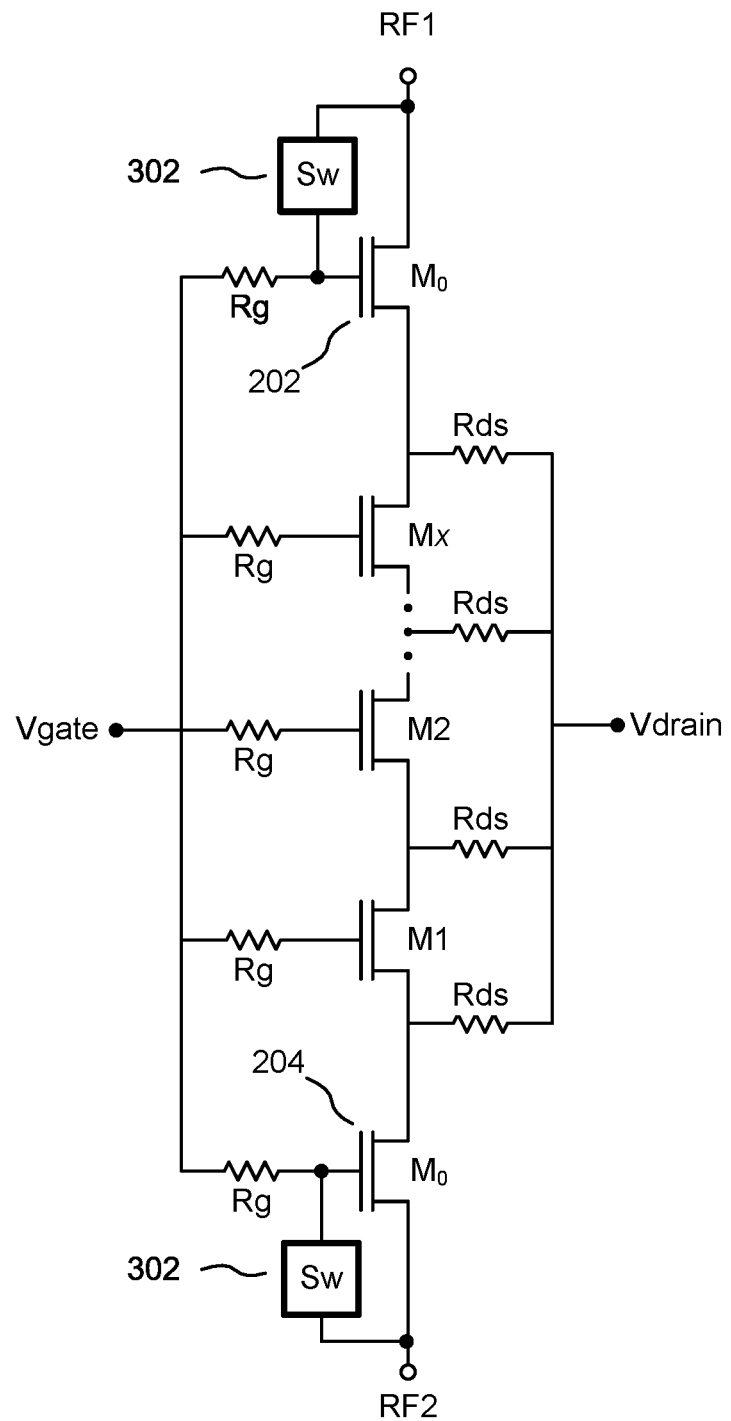
FIG. 3 is a schematic circuit of an RF switch circuit using a stack of "positive logic" FETs, where the stack has zero-$V_{GS}$ end-cap FETs with selectable gate connections.

FIG. 3 is a schematic circuit of an RF switch circuit 300 using a stack of "positive logic" FETs, where the stack has zero-$V_{GS}$ end-cap FETs with selectable gate connections. More specifically, the RF switch circuit 300 includes a stack of one or more series-coupled positive-logic FETs M1-Mx (i.e., zero-Vt, low-Vt, or high-Vt FETs of a type that require a negative $V_{GS}$ to turn OFF but are configured so as to not require a negative voltage), series-coupled on at least one end to an "end-cap" FET $M_0$, where "$M_0$" designates a FET of a high-Vt type that turns OFF when the $V_{GS}$ of such FET is essentially zero volts. The end-cap $M_0$ FETs selectably provide either a capacitive DC blocking function or a resistive signal path. Some embodiments may comprise a stack of only $M_0$ FETs, or a mix of positive-logic FETs and $M_0$ FETs, so long as at least one end-cap FET is an $M_0$ FET. Optional end-cap capacitors (not shown) in parallel with the end-cap $M_0$ FETs may be included to prevent early breakdown of corresponding end-cap $M_0$ FETs.

In the illustrated embodiment, each positive-logic FET M1-Mx includes a dedicated gate resistor Rg coupled between the corresponding FET gate and a non-negative gate bias voltage Vgate. In addition, the source and drain of each positive-logic FET M1-Mx is coupled to a non-negative drain-source (DS) bias voltage Vdrain through a corresponding drain-source resistor Rds (some of the resistors Rds are shared by adjacent FETs). Alternative embodiments may use other bias networks, such as taught in U.S. patent application Ser. No. 15/939,132 referenced above, including various combinations of series-connected bias resistor ladders (a "rail" configuration) and/or parallel-connected bias resistor ladder (a "rung" configuration) and/or a combination of rail-and-rung bias resistor ladders.

Figure 2:
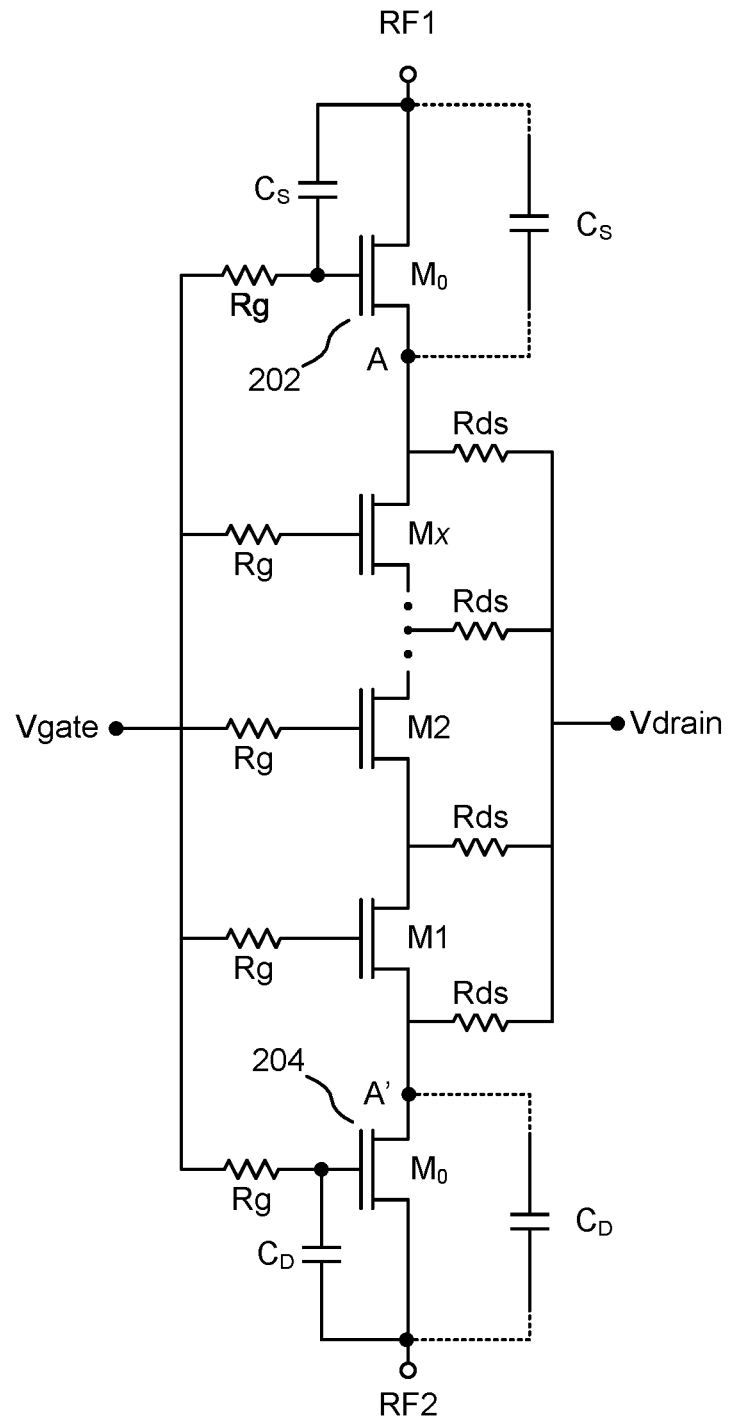
FIG. 2 is a schematic circuit of a prior art RF switch circuit using FET stacks.

While the RF switch circuit 300 of FIG. 3 is similar in many respects to the RF switch circuit 200 of FIG. 2, an important difference is that the terminal capacitors $C_S$, $C_D$ coupled between an adjacent RF terminal RF1, RF2 and the gate of a respective terminal FET 202, 204 are replaced with a switch circuit Sw 302 (note that the control line to each switch Sw 302 is omitted in FIG. 3, but shown in FIGS. 4A-4G).

The function of the switch circuits Sw 302 is to reduce the voltage swing across the terminal $M_0$ FETs 202, 204 to make sure they do not turn ON at higher RF power levels when the RF switch circuit 200 is in an OFF state, yet allow normal function of the terminal $M_0$ FETs 202, 204 when the RF switch circuit 200 is in an ON state. For example, when the RF switch circuit 200 is in an OFF state, the switch circuits Sw 302 are set to an essentially CLOSED (conductive) state such that the gate voltage for the terminal $M_0$ FET 202, 204 to which power is applied follows the voltage applied to the source of that terminal $M_0$ FET. Conversely, when the RF switch circuit 200 is in an ON state, the switch circuits Sw 302 are set to an essentially OPEN (blocking) state such that the gate voltage for the terminal $M_0$ FET to which power is applied is set only by Vgate, and not by any component of DC or RF applied to node.

Described below are a number of circuits for implementing the switch circuits Sw 302, which need not be identical. However, it should be understood that other circuits may be used to implement the switch circuits Sw 302 without departing from the teachings of this disclosure.

Embodiments of Switch Circuit Sw

Figure 4A:
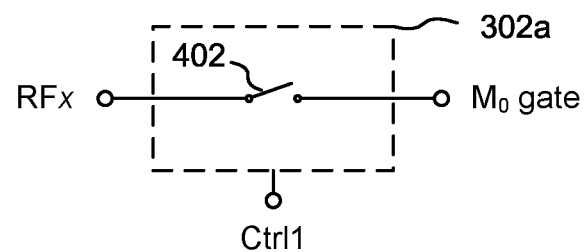
FIG. 4A is a schematic circuit of a first embodiment of a switch circuit Sw that may be used in the RF switch circuit of FIG. 3.

FIG. 4A is a schematic circuit of a first embodiment of a switch circuit Sw 302a that may be used in the RF switch circuit 300 of FIG. 3. The illustrated switch circuit Sw 302a includes a switch 402 coupled to a control signal Ctrl1. The switch 402 would be coupled between a terminal RFx (e.g., RF1 or RF2) and the gate of a terminal $M_0$ FET 202, 204.

The switch 402 may be implemented in any suitable technology compatible with fabrication of the RF switch circuit 300, including (but not limited to) FET, MOSFET, micro-electro-mechanical systems (MEMS) switches, bipolar, GaAs HBT, GaN HEMT, GaAs pHEMT, and MESFET technologies.

In operation, the switch 402 is set by the control signal Ctrl1 to an essentially CLOSED state when the RF switch circuit 200 is in an OFF state, and to an essentially OPEN state when the RF switch circuit 200 is in an ON state. In general, the ON or OFF state of the control signal Ctrl1 is opposite the state (i.e., OFF or ON) of the RF switch circuit 300 as set by Vgate (see FIG. 3). However, in some embodiments, there may be brief periods of time where the control signal Ctrl1 and the RF switch circuit 300 are in the same state.

Figure 4B:
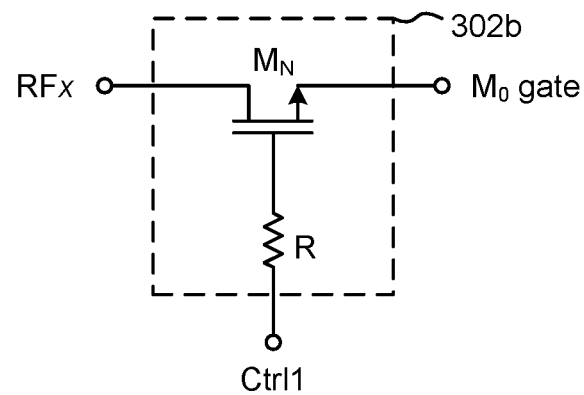
FIG. 4B is a schematic circuit of a second embodiment of a switch circuit Sw that may be used in the RF switch circuit of FIG. 3.

FIG. 4B is a schematic circuit of a second embodiment of a switch circuit Sw 302b that may be used in the RF switch circuit 300 of FIG. 3. The illustrated switch circuit Sw 302b includes an NMOSFET $M_N$ having its gate coupled through a gate resistor R to a control signal Ctrl1. The NMOSFET $M_N$ would be coupled between a terminal RFx (e.g., RF1 or RF2) and the gate of a terminal $M_0$ FET 202, 204 (keeping in mind that the source and drain terminals of the NMOSFET $M_N$ are generally interchangeable).

In essence, switch circuit Sw 302b is an NMOSFET implementation of the switch 402 of FIG. 4A. In operation, the NMOSFET $M_N$ is set by the control signal Ctrl1 to an essentially CLOSED state when the RF switch circuit 200 is in an OFF state, and to an essentially OPEN state when the RF switch circuit 200 is in an ON state. In general, the ON or OFF state of the control signal Ctrl1 is opposite the state (i.e., OFF or ON) of the RF switch circuit 300 as set by Vgate. However, again, in some embodiments there may be brief periods of time where the control signal Ctrl1 and the RF switch circuit 300 are in the same state.

If the gate-drain voltage difference for the NMOSFET $M_N$ becomes too great due to high RF power applied to the RFx terminal of switch circuit Sw 302b in FIG. 4B, the NMOSFET $M_N$ may itself be forced to turn ON. Accordingly, for applications in which such levels of high RF power may be encountered, the switch function of the NMOSFET $M_N$ of FIG. 4B can be enhanced so as to withstand a higher voltage.

Figure 4C:
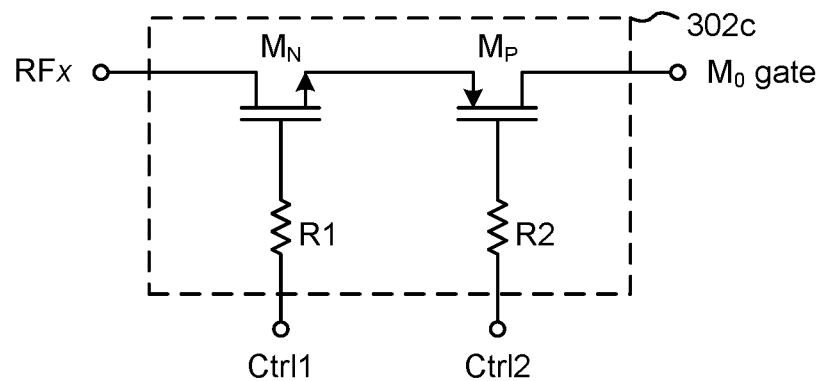
FIG. 4C is a schematic circuit of a third embodiment of a switch circuit Sw that may be used in the RF switch circuit of FIG. 3.

For example, FIG. 4C is a schematic circuit of a third embodiment of a switch circuit Sw 302c that may be used in the RF switch circuit 300 of FIG. 3. The illustrated switch circuit Sw 302c includes an NMOSFET $M_N$ having its gate coupled through a gate resistor R1 to a control signal Ctrl1, and a series-connected PMOSFET $M_P$ having its gate coupled through a gate resistor R2 to a control signal Ctrl2. The NMOSFET $M_N$ and the PMOSFET $M_P$ would be coupled between a terminal RFx (e.g., RF1 or RF2) and the gate of a terminal $M_0$ FET 202, 204 (note the order of the NMOSFET $M_N$ and the PMOSFET $M_P$ may be reversed from the illustrated example).

In operation, the NMOSFET $M_N$ and the PMOSFET $M_P$ are biased by Ctrl1 and Ctrl2 such that, when the NMOSFET $M_N$ is set to OFF, then the PMOSFET $M_P$ is set to OFF, and vice versa. Thus, the NMOSFET $M_N$ and the PMOSFET $M_P$ normally switch between ON and OFF states in unison. However, if the gate-drain voltage difference for the NMOSFET $M_N$ becomes too great due to high RF power applied to the RFx terminal, thus forcing the NMOSFET $M_N$ to an ON state, that same gate-drain voltage difference will force the PMOSFET $M_P$ to an even "harder" OFF state, due to the complementary switching behavior of NMOS and PMOS FETs.

It should be noted that a switch comprising a series-connected NMOSFET $M_N$ and PMOSFET $M_P$ (or a stack of such switches) may be quite useful in other applications in which an NMOSFET $M_N$ (or a stack of such transistors) alone may be forced into an ON (conducting) state by a gate-drain voltage difference.

Figure 4D:
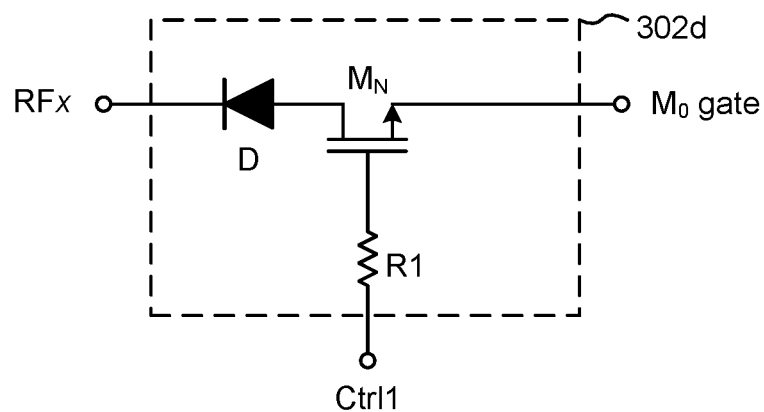
FIG. 4D is a schematic circuit of a fourth embodiment of a switch circuit Sw that may be used in the RF switch circuit of FIG. 3.

It has been found that it may be useful to include a diode as part of a switch circuit Sw 302. For example, FIG. 4D is a schematic circuit of a fourth embodiment of a switch circuit Sw 302d that may be used in the RF switch circuit 300 of FIG. 3. The illustrated switch circuit Sw 302d includes an NMOSFET $M_N$ having its gate coupled through a gate resistor R to a control signal Ctrl1. The NMOSFET $M_N$ is shown as coupled between a terminal RFx (e.g., RF1 or RF2) through a diode D, and to the gate of a terminal $M_0$ FET 202, 204. However, the diode D may be positioned on the other side of NMOSFET $M_N$. The diode D may be implemented in known fashion as a diode-connected MOSFET, in which the gate and drain of a MOSFET are directly connected.

When the RF switch circuit 300 is OFF, when the voltage ($V_S$) at RFx starts to drop below the voltage ($V_G$) at the gate of the $M_0$ FET during the negative cycle of an applied RF signal, the diode D turns ON (is unidirectionally conductive), essentially making the voltage at the gate of the $M_0$ FET follow the voltage at RFx. Conversely, when $V_S$ starts to rise above $V_G$ during the positive cycle of an applied RF signal, the diode D essentially turns OFF (is unidirectionally blocking), essentially preventing the voltage $V_S$ at RFx from being applied to the gate of the $M_0$ FET, thereby preventing the terminal $M_0$ FETs 202, 204 from being forced ON.

It should be noted that if the diode D was connected directly between a terminal RFx (e.g., RF1 or RF2) and the gate of a terminal $M_0$ FET 202, 204, then when the RF switch circuit 300 is ON, the diode D would turn ON when the gate of the associated terminal $M_0$ FET 202, 204 is biased at a sufficiently high level (e.g., 1.8V). The ON state of the diode D would prevent the associated terminal $M_0$ FET 202, 204 from turning ON state. Accordingly, an NMOSFET $M_N$ having its gate coupled through a gate resistor R1 to a control signal Ctrl1 may be interposed between the diode D and the gate of the associated terminal $M_0$ FET 202, 204. The NMOSFET $M_N$ functions as a switch as in the switch circuit Sw 302b of FIG. 4B so as to disconnect the diode D from the gate of the associated terminal $M_0$ FET 202, 204 when the RF switch circuit 300 is ON. Thus, the NMOSFET $M_N$ is OFF (blocking) when the RF switch circuit 300 is ON, and the NMOSFET $M_N$ is ON (conducting) when the RF switch circuit 300 is OFF.

The switch circuit Sw 302d of FIG. 4D works well in applications where the OFF power applied to the RF switch circuit 300 may be high, but the ON power is low. However, in applications where the ON power applied to the RF switch circuit 300 may be high, the NMOSFET $M_N$ may be forced ON when it is supposed to be OFF. Accordingly, for applications in which such levels of high RF power may be encountered, the switch function of the NMOSFET $M_N$ of FIG. 4D can be enhanced so as to withstand a higher voltage.

Figure 4E:
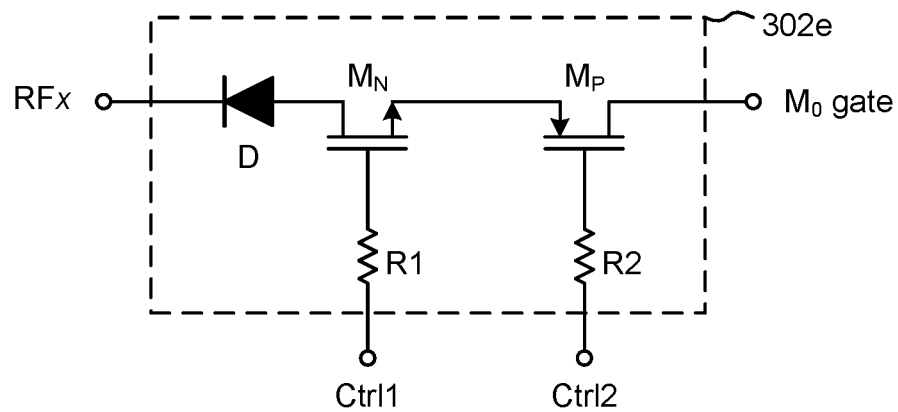
FIG. 4E is a schematic circuit of a fifth embodiment of a switch circuit Sw that may be used in the RF switch circuit of FIG. 3.

For example, FIG. 4E is a schematic circuit of a fifth embodiment of a switch circuit Sw 302e that may be used in the RF switch circuit 300 of FIG. 3. The illustrated switch circuit Sw 302e includes an NMOSFET $M_N$ having its gate coupled through a gate resistor R to a control signal Ctrl1. The NMOSFET $M_N$ is shown as coupled to a terminal RFx (e.g., RF1 or RF2) through a diode D. As with the switch circuit Sw 302c of FIG. 4C, a PMOSFET $M_P$ having its gate coupled through a gate resistor R2 to a control signal Ctrl2 is series-connected to the NMOSFET $M_N$ and to the gate of a terminal $M_0$ FET 202, 204. However, the diode D may be positioned on either side of either the NMOSFET $M_N$ or the PMOSFET $M_P$, and the order of the NMOSFET $M_N$ and the PMOSFET $M_P$ may be reversed from the illustrated example. Stated another way, the diode D, the NMOSFET $M_N$, and the PMOSFET $M_P$ may be series-coupled in any order. The diode D may be implemented in known fashion as a diode-connected MOSFET.

As with the switch circuit Sw 302c of FIG. 4C, in operation, the NMOSFET $M_N$ and the PMOSFET $M_P$ are biased by Ctrl and Ctrl2 such that, when the NMOSFET $M_N$ is set to OFF, then the PMOSFET $M_P$ is set to OFF, and vice versa. Thus, the NMOSFET $M_N$ and the PMOSFET $M_P$ normally switch between ON and OFF states in unison. When both the NMOSFET $M_N$ and the PMOSFET $M_P$ are OFF, the diode D is disconnected from the gate of the associated terminal $M_0$ FET 202, 204 (the desired state when the RF switch circuit 300 is ON). However, if the gate-drain voltage difference for the NMOSFET $M_N$ becomes too great due to high RF power applied to the RFx terminal, thus forcing the NMOSFET $M_N$ to an ON state, that same gate-drain voltage difference will force the PMOSFET $M_P$ to an even "harder" OFF state, thereby keeping the diode D disconnected from the gate of the associated terminal $M_0$ FET 202, 204.

Further, as with the switch circuit Sw 302d of FIG. 4D, when the RF switch circuit 300 is OFF, then both the NMOSFET $M_N$ and the PMOSFET $M_P$ are set to ON and the diode D is connected to the gate of the associated terminal $M_0$ FET 202, 204. When the voltage ($V_S$) at RFx starts to drop below the voltage ($V_G$) at the gate of the $M_0$ FET during the negative cycle of an applied RF signal, the diode D turns ON (is unidirectionally conductive), essentially making the voltage at the gate of the $M_0$ FET follow the voltage at RFx. Conversely, when $V_S$ starts to rise above $V_G$ during the positive cycle of an applied RF signal, the diode D essentially turns OFF (is unidirectionally blocking), essentially preventing the voltage $V_S$ at RFx from being applied to the gate of the $M_0$ FET, thereby preventing the terminal $M_0$ FETs 202, 204 from being forced ON.

Figure 4F:
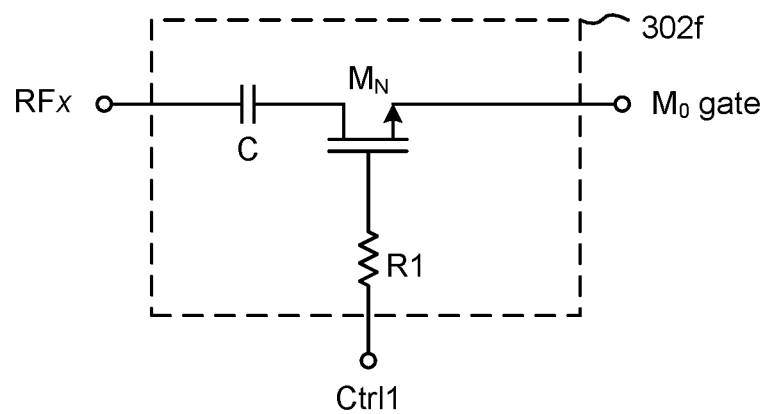
FIG. 4F is a schematic circuit of a sixth embodiment of a switch circuit that may be used in the RF switch circuit of FIG. 3.

FIG. 4F is a schematic circuit of a sixth embodiment of a switch circuit Sw 302f that may be used in the RF switch circuit 300 of FIG. 3. The illustrated switch circuit Sw 302f includes an NMOSFET $M_N$ having its gate coupled through a gate resistor R to a control signal Ctrl1. The NMOSFET $M_N$ is shown as coupled between a terminal RFx (e.g., RF1 or RF2) through a capacitor C, and to the gate of a terminal $M_0$ FET 202, 204. The capacitor C allows the gate of the M0 FET to track the RF signal when the NMOSFET $M_N$ is switched to a CLOSED (conducting) state. The capacitor C may be positioned on either side of the NMOSFET $M_N$. Operation is otherwise the same as the embodiment of FIG. 4B.

Figure 4G:
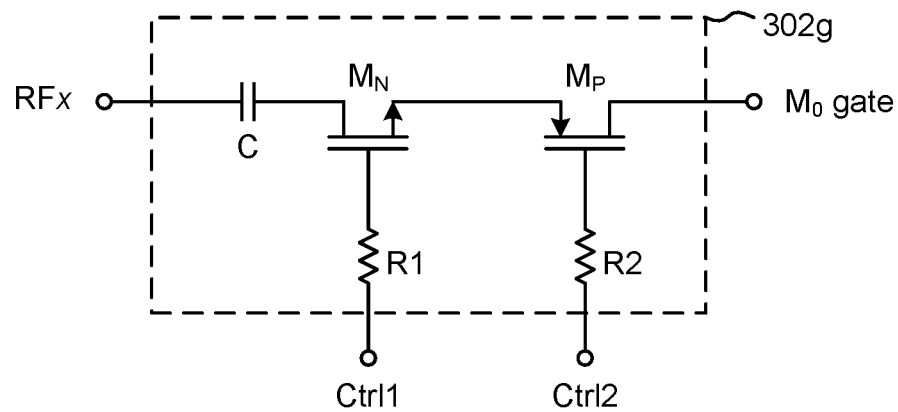
FIG. 4G is a schematic circuit of a seventh embodiment of a switch circuit that may be used in the RF switch circuit of FIG. 3.

FIG. 4G is a schematic circuit of a seventh embodiment of a switch circuit Sw 302g that may be used in the RF switch circuit 300 of FIG. 3. The illustrated switch circuit Sw 302g includes an NMOSFET $M_N$ having its gate coupled through a gate resistor R1 to a control signal Ctrl1, and a series-connected PMOSFET $M_P$ having its gate coupled through a gate resistor R2 to a control signal Ctrl2. The NMOSFET $M_N$ is shown as coupled to a terminal RFx (e.g., RF1 or RF2) through a capacitor C, and the PMOSFET $M_P$ is shown as coupled to the gate of a terminal $M_0$ FET 202, 204 (note the order of the NMOSFET $M_N$ and the PMOSFET $M_P$ may be reversed from the illustrated example). The capacitor C allows the gate of the M0 FET to track the RF signal when the NMOSFET $M_N$ and the PMOSFET $M_P$ are both set to a conducting state. The capacitor C, the NMOSFET $M_N$, and the PMOSFET $M_P$ may be series-coupled in any order. Operation is otherwise the same as the embodiment of FIG. 4C.

Diode Rectifying Effect

A beneficial aspect of including the diode D in the switch circuits Sw 302d, 302e of FIGS. 4D and 4E, respectively, is a rectifying effect when the RF switch circuit 300 is OFF. An RF voltage applied at the RFx terminal will generally have an average DC voltage of zero due to equal positive and negative AC excursions. However, the presence of the diode D will cause the voltage $V_{GS}$ between RFx and the gate of the $M_0$ FET to have an average negative DC value, essentially creating a self-generating negative voltage that will drive the associated terminal $M_0$ FET 202, 204 to a "harder" OFF state. This "harder" OFF state has the effect of reducing signal compression compared to RF switch circuit 200 that utilize terminal capacitors $C_S$, $C_D$ to prevent forced-ON states for the terminal $M_0$ FETs 202, 204.

Figure 1:
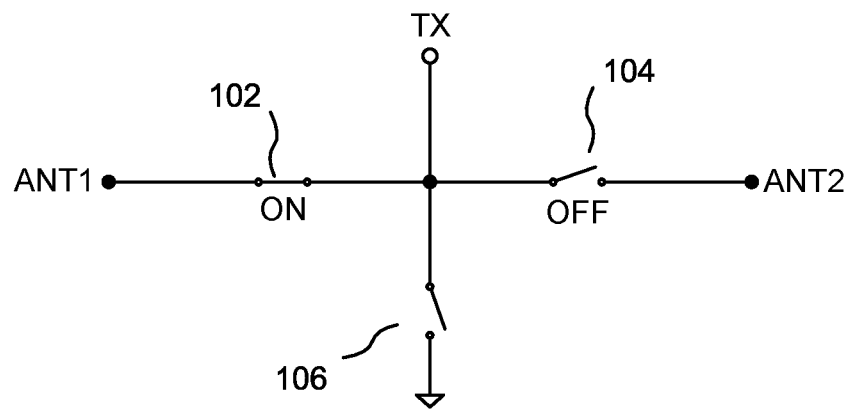
FIG. 1 is a simplified schematic circuit of a common prior art series-shunt RF switch circuit configuration.

For example, in one simulation of a series-shunt two-port RF switch circuit similar to the circuit of FIG. 1 using an RF switch circuit 200 (i.e., having terminal capacitors $C_S$, $C_D$) for the shunt switch 106 (the other switches 102, 104 were modeled as ideal switches), with input power at the TX port being greater than or equal to about 35 dBm, the shunt switch 106 caused compression of about 1 dB at the ANT1 port. While the 1 dB compression point could be adjusted by increasing either the stack height of the shunt switch 106 or the value of the compensation terminal capacitors $C_S$, $C_D$, doing so would hurt the small signal performance of the RF switch circuit 200.

In contrast, under similar modeling conditions but using an RF switch circuit 300 (i.e., having a diode-based switch circuit Sw 302d, 302e) for the shunt switch 106 (the other switches 102, 104 were modeled as ideal switches), with input power at the TX port being greater than or equal to about 35 dBm, the shunt switch 106 caused essentially no compression at the ANT1 port.

Benefits

All of the switch circuits Sw 302x described above have the advantage of lower IC area compared to using terminal capacitors $C_S$, $C_D$ to prevent forced-ON states for the terminal $M_0$ FETs 202, 204. In addition, the switch circuits Sw 302x that include a diode provide the benefits of rectification described above.

Methods

Another aspect of the invention includes methods for enabling a FET-based RF switch stack to withstand application of a high voltage RF signal without requiring terminal capacitors. For example, one such method applies to a stack of FET switches, at least one FET switch requiring a negative $V_{GS}$ to turn OFF and configured so as to not require a negative voltage, series-coupled on at least one end to an end-cap FET that turns OFF when the $V_{GS}$ of such end-cap FET is essentially zero volts. The method includes: coupling a switch circuit between the RF signal source and the gate of at least one end-cap FET; closing the switch circuit(s) when the stack of FET switches is in an OFF state; and opening the switch circuit(s) when the stack of FET switches is in an ON state. Examples of such switch circuits are shown in FIGS. 4A-4G.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A stack of FET switches, at least one FET switch of the stack of FET switches requiring a relatively negative $V_{GS}$ to turn OFF and configured so as to not require a negative voltage, the stack of FET switches series-coupled on at least one end to a respective end-cap FET that turns OFF when the $V_{GS}$ of such end-cap FET is essentially zero volts, wherein at least one of the respective end-cap FETs is configured to be coupled to a corresponding RF signal source and has a gate couplable to the corresponding RF signal source through an associated switch circuit.

2. The invention of claim 1, wherein the switch circuit includes an NMOSFET.

3. The invention of claim 1, wherein the switch circuit includes an NMOSFET series-coupled to a PMOSFET.

4. The invention of claim 1, wherein the switch circuit includes a diode series-coupled to a NMOSFET.

5. The invention of claim 1, wherein the switch circuit includes a diode, NMOSFET, and PMOSFET coupled in series.

6. The invention of claim 1, wherein the switch circuit includes a capacitor series-coupled to a NMOSFET.

7. The invention of claim 1, wherein the switch circuit includes a capacitor, NMOSFET, and PMOSFET coupled in series.

8. A stack of FET switches, at least one FET switch of the stack of FET switches requiring a relatively negative $V_{GS}$ to turn OFF and configured to operate with positive control voltages, the stack of FET switches series-coupled on at least one end to a respective end-cap FET that turns OFF when the $V_{GS}$ of such end-cap FET is essentially zero volts, wherein at least one of the respective end-cap FETs is configured to be coupled to a corresponding RF signal source and has a gate couplable to the corresponding RF signal source through an associated switch circuit.

9. The invention of claim 8, wherein the switch circuit includes an NMOSFET.

10. The invention of claim 8, wherein the switch circuit includes an NMOSFET series-coupled to a PMOSFET.

11. The invention of claim 8, wherein the switch circuit includes a diode series-coupled to a NMOSFET.

12. The invention of claim 8, wherein the switch circuit includes a diode, NMOSFET, and PMOSFET coupled in series.

13. The invention of claim 8, wherein the switch circuit includes a capacitor series-coupled to a NMOSFET.

14. The invention of claim 8, wherein the switch circuit includes a capacitor, NMOSFET, and PMOSFET coupled in series.

15. A FET switch stack, including:
(a) one or more positive-logic FETs requiring a relatively negative $V_{GS}$ to turn OFF and configured so as to not require a negative voltage;
(b) a first end-cap FET that turns OFF when the $V_{GS}$ of the first end-cap FET is essentially zero volts, series-coupled to a first end of the one or more series-coupled positive-logic FETs, wherein the first end-cap FET has a gate and is configured to be coupled to a corresponding RF signal source; and
(c) at least one switch circuit, each coupled between the gate of the first end-cap FET and the corresponding RF signal source.

16. The invention of claim 15, wherein the switch circuit includes an NMOSFET.

17. The invention of claim 15, wherein the switch circuit includes an NMOSFET series-coupled to a PMOSFET.

18. The invention of claim 15, wherein the switch circuit includes a diode series-coupled to a NMOSFET.

19. The invention of claim 15, wherein at least one of the at least one switch circuit includes a diode, NMOSFET, and PMOSFET coupled in series.

20. The invention of claim 15, wherein the switch circuit includes a capacitor series-coupled to a NMOSFET.

21. The invention of claim 15, wherein the switch circuit includes a capacitor, NMOSFET, and PMOSFET coupled in series.

* * * * *